United States Patent [19]

Mori

[11] Patent Number: 5,436,911
[45] Date of Patent: * Jul. 25, 1995

[54] SEMICONDUCTOR MEMORY DEVICE COMPRISING A TEST CIRCUIT AND A METHOD OF OPERATION THEREOF

[75] Inventor: Shigeru Mori, Hyogo, Japan

[73] Assignee: Mitsubishi Denki Kabushiki Kaisha, Tokyo, Japan

[*] Notice: The portion of the term of this patent subsequent to Jan. 24, 2012 has been disclaimed.

[21] Appl. No.: 307,082

[22] Filed: Sep. 16, 1994

Related U.S. Application Data

[63] Continuation of Ser. No. 750,050, Aug. 27, 1991, abandoned.

[30] Foreign Application Priority Data

Aug. 29, 1990 [JP] Japan .................. 2-229087
Aug. 6, 1991 [JP] Japan .................. 3-196823

[51] Int. Cl.[6] .............................. G11C 7/00
[52] U.S. Cl. .................... 371/21.1; 371/21.2; 365/189.01; 365/201
[58] Field of Search ........... 364/579, 580; 371/21.1, 371/2, 3, 25.1; 365/208, 149, 189.01, 201

[56] References Cited

U.S. PATENT DOCUMENTS

| | | | |
|---|---|---|---|
| 4,479,202 | 10/1984 | Uchida | 365/190 |
| 4,713,797 | 12/1987 | Morton et al. | 365/208 |
| 4,930,067 | 5/1990 | Nakamura | 365/189.01 |
| 4,954,992 | 9/1990 | Kumanoya et al. | 365/207 |
| 4,984,206 | 1/1991 | Komatsu et al. | 365/149 |
| 5,075,892 | 12/1991 | Choy | 371/68.1 |
| 5,130,580 | 7/1992 | Min et al. | 307/451 |
| 5,185,744 | 2/1993 | Arimoto et al. | 371/21.1 |
| 5,272,665 | 12/1993 | Uejugi | 365/208 |
| 5,276,647 | 1/1994 | Matsui et al. | 371/21.1 |
| 5,278,785 | 1/1994 | Hazani | 365/189.01 |
| 5,289,412 | 2/1994 | Frary et al. | 365/189.01 |
| 5,293,386 | 3/1994 | Muhmenthaler | 371/21.1 |
| 5,295,094 | 3/1994 | Miyatake | 365/208 |

FOREIGN PATENT DOCUMENTS

0264893A2 4/1988 European Pat. Off. .
291283 11/1988 European Pat. Off. .

OTHER PUBLICATIONS

1989 IEEE International Solid-State Circuits Conference, Digest of Technical Papers, Feb. 1989, Session 16: Dynamic RAMs, FAM 16.4; A 60ns 3.3V 16Mb DRAM, Arimoto et al.
1987 Symposium on VLSI Circuits, Digest of Technical Papers, May 1987, IEEE Ct. No. 87 TH 0190-9, "BIC-MOS Circuit Technology for high Speed DRAMs", Watanabe et al.
1990 Symposium on VLSI Circuits, Digest of Technical Papers, Jun. 1990, IEEE Cat. No. 90 CH 2885-2, "A 1.5V Circuit Technology for 64Mb DRAMs", Nakagome et al.

Primary Examiner—Emanuel T. Voeltz
Assistant Examiner—Hal D. Wachsman
Attorney, Agent, or Firm—Lowe, Price, LeBlanc & Becker

[57] ABSTRACT

A semiconductor memory device comprises a memory array. Each bit line pairs connected to a first amplifier. Write buses, read buses and a read/test circuit are provided. A column decoder selects simultaneously every other plurality of bit line pair at the time of testing. The read/test circuit compares the data read out from the selected plurality of bit line pair with the given expected data to provide the comparison result. Then the column decoder selects simultaneously the remaining one other plurality of bit line pairs. The read/test circuit compares data read out from the selected plurality of bit line pair with a given expected data to provide the comparison result.

23 Claims, 24 Drawing Sheets

(NORMAL OPERATION)

FIG. 5

(X ADDRESS)

|  | WL1 | WL2 | WL3 | WL4 | WL5 | ---- |
|---|---|---|---|---|---|---|
| BL1 | H | L | H | L | H | ---- |
| BL2 | L | H | L | H | L | ---- |
| BL3 | H | L | H | L | H | ---- |
| BL4 | L | H | L | H | L | ---- |
| BL5 | H | L | H | L | H | ---- |
| BL6 | L | H | L | H | L | ---- |

(Y ADDRESS)

(ASYMMETRIC TYPE DIFFERENTIAL AMP.)

(SYMMETRIC TYPE DIFFERENTIAL AMP.)

FIG. 19

Y ADDRESS

|   | 1 | 2 | 3 | 4 | 5 | 6 | 7 | 8 | ... |
|---|---|---|---|---|---|---|---|---|---|
| 1 | H | H | H | H | H | H | H | H | |
| 2 | L | L | L | L | L | L | L | L | |
| 3 | H | H | H | H | H | H | H | H | |
| 4 | L | L | L | L | L | L | L | L | |
| 5 | H | H | H | H | H | H | H | H | |
| 6 | L | L | L | L | L | L | L | L | |
| 7 | H | H | H | H | H | H | H | H | |
| 8 | L | L | L | L | L | L | L | L | |

X ADDRESS (ROW STRIPE)

FIG. 20

Y ADDRESS

|   | 1 | 2 | 3 | 4 | 5 | 6 | 7 | 8 | ... |
|---|---|---|---|---|---|---|---|---|---|
| 1 | H | L | H | L | H | L | H | L | |
| 2 | L | H | L | H | L | H | L | H | |
| 3 | H | L | H | L | H | L | H | L | |
| 4 | L | H | L | H | L | H | L | H | |
| 5 | H | L | H | L | H | L | H | L | |
| 6 | L | H | L | H | L | H | L | H | |
| 7 | H | L | H | L | H | L | H | L | |
| 8 | L | H | L | H | L | H | L | H | |

X ADDRESS (CHECKER BOARD)

FIG. 21

Y ADDRESS

| | 1 | 2 | 3 | 4 | 5 | 6 | 7 | 8 |
|---|---|---|---|---|---|---|---|---|
| 1 | H | H | H | H | H | H | H | H |
| 2 | H | H | H | H | H | H | H | H |
| 3 | L | L | L | L | L | L | L | L |
| 4 | L | L | L | L | L | L | L | L |
| 5 | H | H | H | H | H | H | H | H |
| 6 | H | H | H | H | H | H | H | H |
| 7 | L | L | L | L | L | L | L | L |
| 8 | L | L | L | L | L | L | L | L |

X ADDRESS (2-ROW STRIPE)

FIG. 22

Y ADDRESS

| | 1 | 2 | 3 | 4 | 5 | 6 | 7 | 8 |
|---|---|---|---|---|---|---|---|---|
| 1 | H | L | H | L | H | L | H | L |
| 2 | H | L | H | L | H | L | H | L |
| 3 | L | H | L | H | L | H | L | H |
| 4 | L | H | L | H | L | H | L | H |
| 5 | H | L | H | L | H | L | H | L |
| 6 | H | L | H | L | H | L | H | L |
| 7 | L | H | L | H | L | H | L | H |
| 8 | L | H | L | H | L | H | L | H |

X ADDRESS (2-COLUMN CHECKER)

FIG. 23

Y ADDRESS

| | 1 | 2 | 3 | 4 | 5 | 6 | 7 | 8 | ........ |
|---|---|---|---|---|---|---|---|---|---|
| 1 | H | H | L | L | H | H | L | L | |
| 2 | H | H | L | L | H | H | L | L | |
| 3 | L | L | H | H | L | L | H | H | |
| 4 | L | L | H | H | L | L | H | H | |
| 5 | H | H | L | L | H | H | L | L | |
| 6 | H | H | L | L | H | H | L | L | |
| 7 | L | L | H | H | L | L | H | H | |
| 8 | L | L | H | H | L | L | H | H | |

X ADDRESS (DOUBLE CHECKER)

FIG. 24

Y ADDRESS

| | 1 | 2 | 3 | 4 | 5 | 6 | 7 | 8 | ........ |
|---|---|---|---|---|---|---|---|---|---|
| 1 | H | L | H | L | H | L | H | L | |
| 2 | H | L | H | L | H | L | H | L | |
| 3 | H | L | H | L | H | L | H | L | |
| 4 | H | L | H | L | H | L | H | L | |
| 5 | H | L | H | L | H | L | H | L | |
| 6 | H | L | H | L | H | L | H | L | |
| 7 | H | L | H | L | H | L | H | L | |
| 8 | H | L | H | L | H | L | H | L | |

X ADDRESS (COLUMN STRIPE)

(X ADDRESS)

SEMICONDUCTOR MEMORY DEVICE COMPRISING A TEST CIRCUIT AND A METHOD OF OPERATION THEREOF

CROSS-REFERENCE TO RELATED APPLICATIONS

This application is a continuation of application Ser. No. 07/750,050 filed Aug. 27, 1991, now abandoned.

This application is related to copending applications Ser. No. 400,899, filed Aug. 30, 1989 now U.S. Pat. No. 5,060,230 506,616 filed Apr. 10, 1990 now U.S. Pat. No. 5,022,007 and 750,040 filed Aug. 27, 1991 now U.S. Pat. No. 5,384,784; commonly assigned with the present invention.

BACKGROUND OF THE INVENTION

1. Field of the Invention

The present invention relates to semiconductor memory devices, and more particularly, to a semiconductor memory device comprising a test circuit, and a method of operation thereof.

2. Description of the Background Art

In recent years, increase in testing time has become significant as the size of semiconductor devices has increased. As a technique to reduce testing time drastically, a line mode test is proposed in 1989 IEEE International Solid-State Circuits Conference Digest of Technical Papers, pp. 244–245. According to this line mode test, all the memory cells connected to one word line are tested simultaneously to allow testing of a number of bits at one time. This is expected to reduce testing time significantly.

FIG. 31 shows the structure of main components of a conventional dynamic type semiconductor memory device having a line mode test function.

Referring to FIG. 31, a plurality of bit line pairs BL, $\overline{BL}$ and a plurality of word lines WL are arranged perpendicular to each other, with a memory cell MC at each crossing point. The plurality of word lines WL are connected to a row decoder 3 comprising a decoder 31 and a word driver 32. A sense amplifier 50 is connected to each bit line pair BL, $\overline{BL}$. Each bit line pair BL, $\overline{BL}$ is connected to input/output line pair I/O, I/O via N channel MOS transistors 121, 122 and N channel MOS transistors 125, 126. Transistors 121, 122, 125 and 126 implement a transfer gate. The gates of transistors 125 and 126 are supplied with a column selecting signal Yi (i=1, 2, ...) from a column decoder 4. A comparison circuit 100 and a latch circuit 110 are provided corresponding to each bit line pair BL, $\overline{BL}$.

Row decoder 3 is responsive to an externally applied row address signal RA to select one of the plurality of word lines WL, to raise the potential thereof to a H level. A column decoder 4 is responsive to an externally applied column address signal CA to select one of the plurality of bit line pairs BL, $\overline{BL}$ to provide column selecting signal Yi of a H level to the gates of the corresponding transistors 125 and 126. Thus, one memory cell MC is selected, whereby data is written into the selected memory cell MC via input/output line pair I/O, I/O, or data stored in the selected memory cell MC is read out to an external source via input/output line pair I/O, I/O.

The line mode test will be explained hereinafter. In line mode test, an externally applied expected data is first stored in a latch circuit 110. Data read out from the memory cell MC connected to the selected word line WL and the expected data stored in latch circuit 110 are compared by a comparison circuit 100. Hence, the testing of a plurality of memory cells MC connected to one word line WL is performed at one time.

First, writing test data into memory cell MC will be explained.

Transistors 125 and 126 selected by column decoder 4 are turned on. This causes external test data applied through input/output line pair I/O, I/0 to be transmitted to nodes NA and NB. This test data is stored in latch circuit 110. The test data stored in latch circuit 110 is the expected data at the time of testing. Signal TR is at a L level at this time. Transistors 121 and 122 are off and test data in nodes NA and NB are not transmitted to bit line pair BL, $\overline{BL}$. By sequentially selecting a plurality of pairs of transistors 125 and 126 by column decoder 4, test data is sequentially stored in a plurality of latch circuits 110.

Signal TR then rises to a H level. This turns transistors 121 and 122 on. One of the plurality of word lines WL is selected by row decoder 3. This causes the test data stored in latch circuit 110 to be written into each memory cell MC connected to the selected word line WL. By sequentially selecting a plurality of word lines WL by row decoder 3, test data is written into all the memory cells MC.

The read out of the test data stored in memory cell MC, and the comparison of the read out test data with the expected data will be explained hereinafter.

One of the plurality of word lines WL is selected by the row decoder 3. This causes test data to be read out from the memory cell MC connected to the selected word line WL into the corresponding bit line pair BL, $\overline{BL}$. The read out test data is amplified by the corresponding sense amplifier 50.

Signal LTE rises to a H level, while signal TR is still at the L level. This turns on N channel MOS transistors 123 and 124. As a result, the test data read out from each memory cell are transmitted to the corresponding comparison circuits 100. Each comparison circuit 100 is supplied with the expected data stored in latch circuit 110 via nodes NA, NB and NV, NW. Each comparison circuit 100 compares the test data read out from memory cell MC with the expected data stored in latch circuit 110 to provide the comparison result to detection line LTS.

When the test data read out from memory cell MC matches the expected data stored in latch circuit 110 in all comparison circuits 100, the potential of detection line LTS is maintained at a H level. If the test data read out from memory cell MC does not match the expected data stored in latch circuit 110 in at least one comparison circuit 110, the potential of detection line LTS is discharged to a L level.

FIG. 32 shows in detail the structure of comparison circuit 100 and latch circuit 110 of FIG. 31.

Comparison circuit 100 comprises N channel MOS transistors 101–104. Latch circuit 110 comprises N channel MOS transistors 111, 112 and P channel MOS transistors 113, 114.

When column selecting signal Yi attains a H level by column decoder 4 (FIG. 31), transistors 125 and 126 are turned on. This causes externally applied test data to be transmitted to nodes NA and NB via input/output line pair I/O, I/O and to be stored in latch circuit 110. When signal CRE attains a H level and signal $\overline{CRE}$ attains a L level, N channel MOS transistor 127 and P channel MOS transistor 128 are each turned on. This causes the potential of H level of either nodes NA or NB to be set to the supply level, and the potential of the L level set to the ground level.

At the time of testing, the potential of node NC is in advance set to a L level, by turning on N channel MOS transistor 103 with signal LTR. The potential of detection line LTS is set to a H level in advance.

When signal LTE rises to a H level while signal TR remains at a L level, transistors 123 and 124 are turned on. This causes nodes NE and NF of bit line pair BL, $\overline{BL}$ to be connected to comparison circuit 100. For example, if the potential of node NA is at a H level, and the potential of node NB is at a L level, transistor 102 is on and transistor 101 is off.

If correct test data is read out from memory cell MC, the potential of node NE is at a H level, and the potential of node NF is at a L level. The potential of node NC remains at a L level. Therefore, N channel MOS transistor 104 is off, and the potential of node ND of detection line LTS remains at a H level.

If erroneous test data is read out from memory cell MC, the potential of node NE is at a L level, and the potential of node NF is at the H level. The potential of node NC therefore attains a H level to turn on transistor 104. This causes the potential of node ND of detection line LTS to drop to L. Hence, error is detected.

Although test operation regarding one pair of bit lines BL and $\overline{BL}$ is described in FIG. 32, the above-mentioned operation is carried out for all bit line pairs BL, $\overline{BL}$ at one time. Even if only one erroneous test data is read out from one memory cell MC, node ND of detection line LTS drops to a L level.

The line mode test of a conventional dynamic type semiconductor memory device can be summarized as follows.

First, an external applied test data is stored in a plurality of latch circuits 110. Then, test data from a plurality of latch circuits 110 are written into a plurality of memory cells connected to a selected word line WL at one time. This writing operation is repeated for each word line.

Then, test data are read out from a plurality of memory cells MC connected to the selected word line WL simultaneously. The read out test data are compared with the data stored in latch circuits 110. This read out operation and comparison operation are also carried out for each word line.

Line mode test is completed when the test data read out from memory cell MC matches the expected data stored in latch circuit 110 in each comparison operation. If the test data read out from memory cell MC does not match the expected data stored in latch circuit 110 even in one comparison operation, an error flag of a L level is provided from detection line LTS.

It is necessary to provide a plurality of latch circuits and a plurality of comparison circuits corresponding to the number of plurality of bit line pairs for carrying out the line mode test in the above conventional semiconductor memory device. This arrangement disadvantageously consumes increased layout area.

It was necessary to carry out one writing operation, for each bit line pair in writing the test data to the plurality of latch circuits and bit line pairs. Therefore, reduction in testing time could not be expected.

SUMMARY OF THE INVENTION

An object of the present invention is to reduce testing time of a semiconductor memory device without increasing layout area.

Another object of the present invention is to provide a semiconductor memory device capable of high speed operation without a large increase in layout area for a test circuit, and with significant reduction in testing time.

A further object of the present invention is to allow testing of various test patterns at high speed without increasing layout area.

A still further object of the present invention is to provide an operation method of allowing reduction in testing time and capable of reading out data at high speed in a semiconductor memory device comprising a test circuit without increasing layout area.

A semiconductor memory device according to the present invention includes a memory array having a plurality of memory cells arranged in a plurality of rows and columns. The semiconductor memory device further comprises a selecting circuit, a reading circuit, a testing circuit and an indicating circuit. The selecting circuit simultaneously selects a predetermined number of columns of the memory array in a selected row during testing operation and selects one of the plurality of columns during normal operation. The reading circuit reads data stored in the memory cells of the selected row and columns. The test circuit simultaneously compares data read by the reading circuit with a predetermined expected data during testing operation. The indicating circuit provides a result of the test circuit. The test circuit comprises a plurality of first amplifiers corresponding respectively to the plurality of columns of the memory array, second amplifier and an expected data input circuit for storing an expected data.

The first amplifiers corresponding to the column selected by the selecting circuit and the second amplifier form a current mirror type amplifier during normal read operation.

Each of the first amplifiers corresponding to the columns selected by the selecting circuit compares data read out from the corresponding column with the expected data during testing operation.

According to the semiconductor memory device, data read out from each of the selected plurality of columns is compared with the expected data, whereby the comparison result is output.

The testing time is reduced by virtue of the test circuit carrying out testing of a plurality of columns simultaneously. Increase in layout area by the test circuit is minimized because the test circuit is provided in common to a plurality of columns. Testing of memory cells by various test patterns can be carried out by setting a different expected data for each group of a plurality of bit line pairs selected simultaneously.

Thus, a semiconductor memory device that can reduce testing time significantly with little increase in layout area can be obtained.

According to another aspect of the present invention, a semiconductor memory device includes a memory array having a plurality of word lines, a plurality of bit line pairs provided to cross the plurality of word lines, and a plurality of memory cells provided at the crossings of the word lines and the bit line pairs.

The semiconductor memory device further includes a write bus, a read bus, a plurality of first amplifiers each provided between each of the plurality of bit line pairs and the read bus, and a second amplifier.

The semiconductor memory device further includes an expected data input circuit, a selecting circuit, a connecting circuit, and an activation circuit. The expected data input circuit stores an expected data. The selecting circuit selects one of the plurality of bit line pairs for reading and writing during normal operation, and simultaneously selects a predetermined number of bit line pairs during testing operation. The connecting circuit connects a bit line pair selected by the selecting circuit to the write bus during normal operation. The activation circuit activates a first amplifier corresponding to a selected bit line pair.

During normal reading operation, the activated first amplifier and the second amplifier form a current mirror type amplifier. During testing operation, the activated first amplifier compares data of the corresponding bit line pair with the expected data for providing the comparison result to the read bus.

According to the semiconductor memory device, the predetermined number of bit line pairs are selected simultaneously, whereby the first amplifier corresponding to the selected bit line pairs are activated during testing operation. With the activated first amplifier, the data of the corresponding bit line pair and the data applied by the expected data input circuit are compared to provide the comparison result to the read bus. The first amplifier acts as the comparison means at this time.

The testing time is reduced due to the first amplifier carrying out testing of a plurality of bit line pairs simultaneously. Testing of memory cells by various test patterns can be carried out by applying different expected data with the expected value input circuit for each group of the plurality of bit line pairs selected simultaneously.

During normal reading operation, one of the plurality of bit line pairs is selected, whereby the first amplifier corresponding to the selected bit line pair is activated. The activated first amplifier and the second amplifier form a current mirror type amplifier.

Thus, data in the selected bit line pair is amplified to be read out at high speed to the read bus. The first amplifier acts as amplifying means at this time.

Attention is directed to the fact that high speed data read out is possible because the write bus is not connected to the bit line pair during normal reading operation.

During normal writing operation, one of the plurality of bit line pairs is selected, whereby the selected bit line pair is connected to the write bus.

This allows data to be written via the write bus into the memory cell connected to the selected bit line pair.

According to the semiconductor memory device, the first amplifier acts as comparison means during testing operation and as amplifying means during normal reading operation, and the second amplifier is provided in common to the plurality of bit line pairs. Therefore, there is little increase in layout area by the test circuit.

Thus, a semiconductor memory device capable of high speed operation is obtained with little increase in layout area and great reduction in testing time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for explaining an example of line mode testing according to the semiconductor memory of FIG.

FIG. 13 is a circuit diagram showing a further example of a first differential amplifier.

FIGS. 19–24 are diagrams each showing an example of a field pattern.

FIGS. 28 are model diagrams showing a memory array divided into a plurality of block arrays.

DESCRIPTION OF THE PREFERRED EMBODIMENTS

Figure 1:
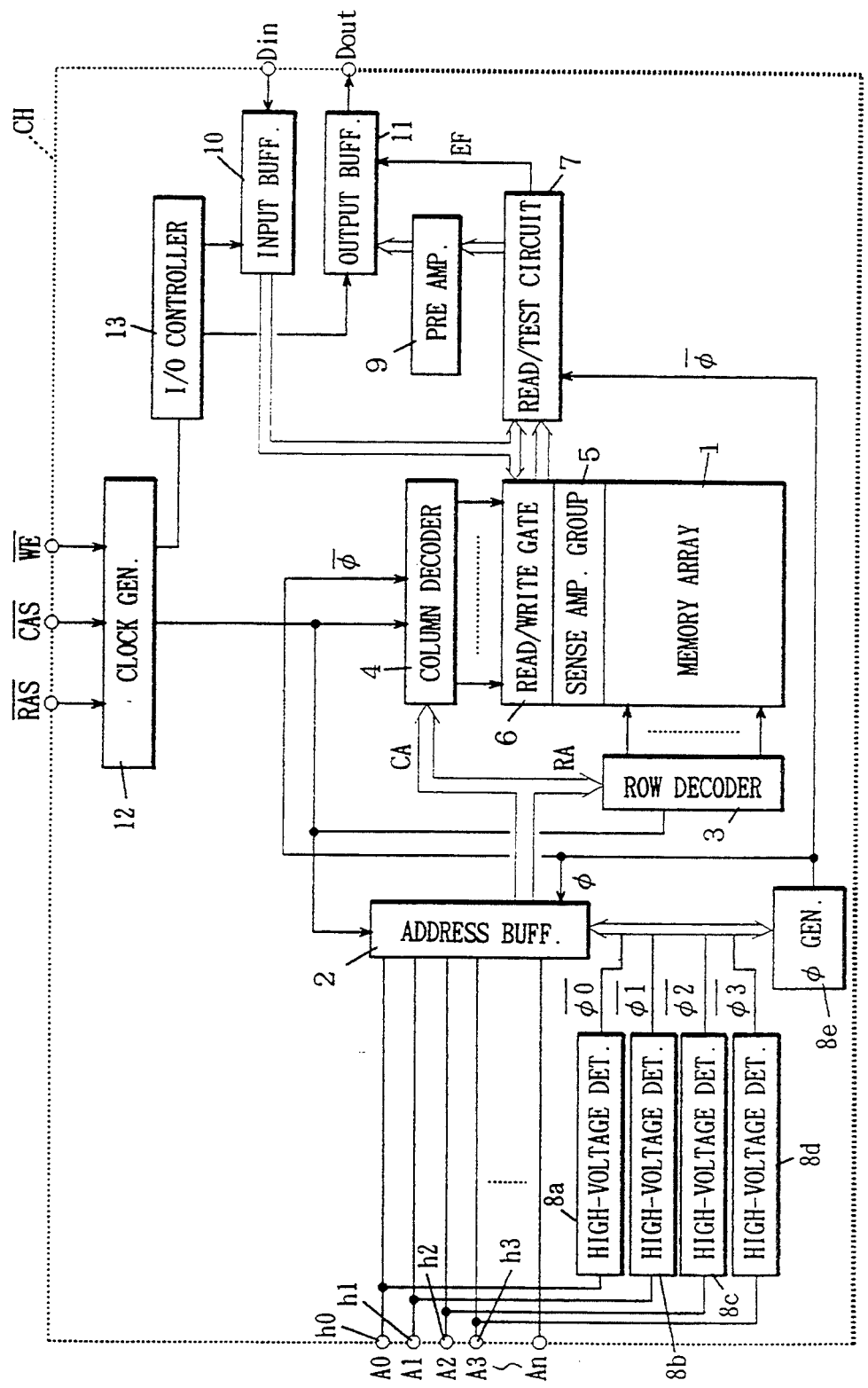
FIG. 1 is a block diagram showing a structure of the entire chip of the semiconductor memory device according to an embodiment of the present invention.

FIG. 1 is a block diagram showing a chip structure of a dynamic type semiconductor memory device according to an embodiment of the present invention.

A memory array 1 comprises a plurality of memory cells having a plurality of rows and columns arranged in a matrix manner. An address buffer 2 receives external address signals A0-An to provide a row address signal RA and a column address signal CA to a row decoder 3 and a column decoder 4, respectively, at a predetermined timing. A read/write gate 6 is connected to memory array 1 via a sense amplifier group 5. A read/test circuit 7 is connected to read/write gate 6.

high-voltage detectors 8a-8d are responsive to the potentials of input terminals h0-h3 which receive address signals A0-A3 to generate signals $\phi 0$-$\phi 3$ and apply the same to address buffer 2 and a $\phi$ generating circuit 8e. $\phi$ generating circuit 8e is responsive to the signals $\phi 0$-$\phi 3$ to generate a test enable signal $\phi$. This test enable signal $\phi$ is applied to address buffer 2, column decoder 4 and read/test circuit 7. The output of read/test circuit 7 is provided to an external source as output data Dout via a preamplifier 9 and an output buffer 11. An external input data Din is applied to read/write gate 6 via an input buffer 10.

A clock generator 12 is responsive to externally applied row address strobe signal $\overline{RAS}$, column address strobe signal $\overline{CAS}$, and write enable signal $\overline{WE}$ to control the timing of each component. An I/O controller 13 activates input buffer 10 at the time of data writing, and activates output buffer 11 at the time of data read out. At line mode testing, in response to an error detection, output buffer 11 provides an error flag EF from read/test circuit 7 to an external source. Each component shown in FIG. 1 is formed on chip CH.

Figure 2:
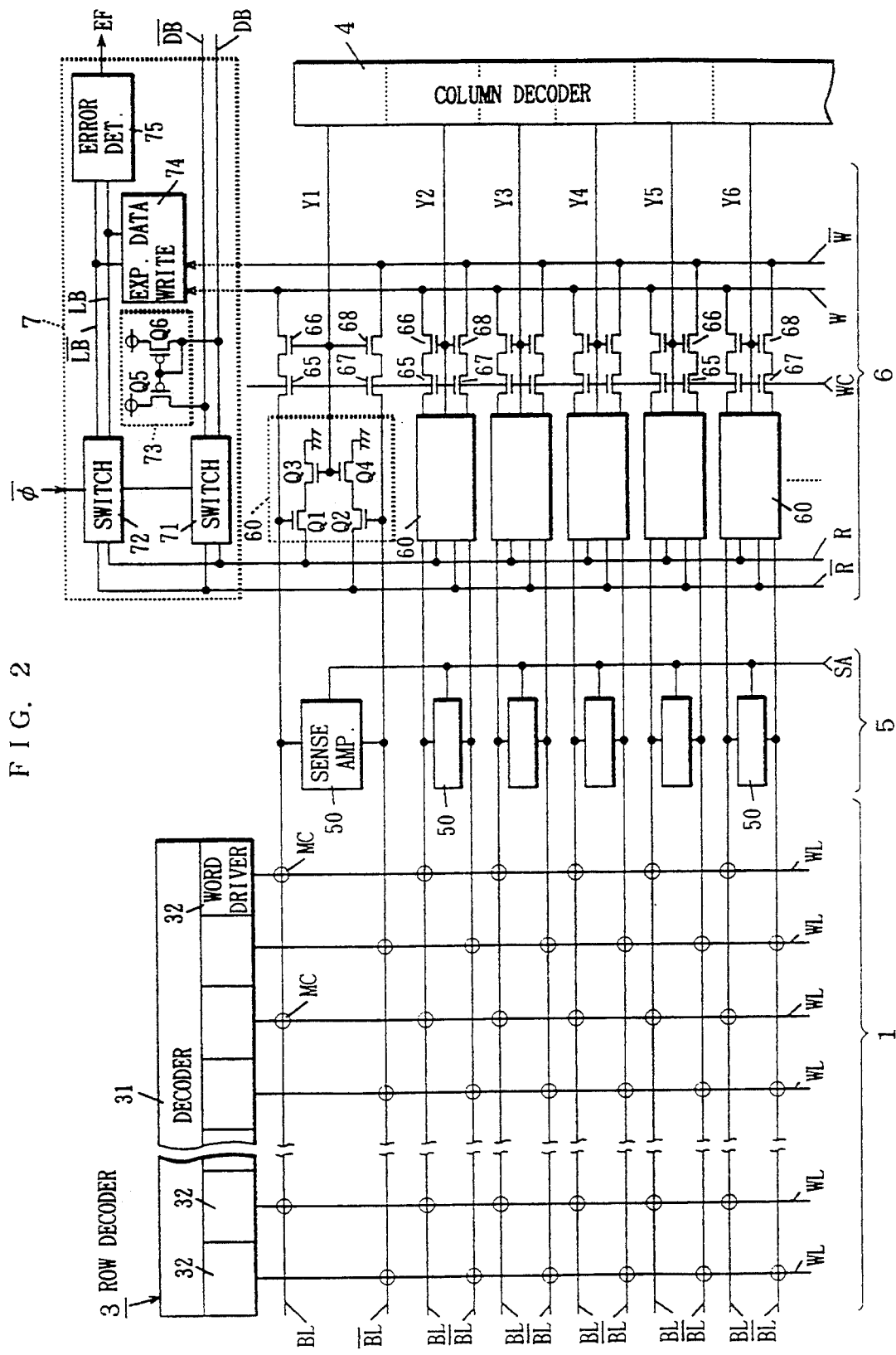
FIG. 2 is a circuit diagram showing a structure of the main components of the semiconductor memory device of FIG. 1.

FIG. 2 is a circuit diagram showing in detail a structure of the main components of the semiconductor memory device of FIG. 1.

Similar to a conventional semiconductor memory device, memory array 1 comprises a plurality of bit line pairs BL, $\overline{BL}$, a plurality of word lines WL arranged to cross bit line pairs BL, BL, and a plurality of memory cells MC provided at the crossing points thereof. The plurality of word lines WL are connected to row decoder 3. Row decoder 3 comprises a decoder 31 selecting one of the plurality of word lines WL in response to row address signal RA, and a word driver 32 for driving the potential of the selected word line WL to a H level. A sense amplifier 50 is connected between each bit line pair BL and e,ovs BL×.

A first differential amplifier 60 is connected to each bit line pair BL, $\overline{BL}$. The semiconductor memory device is provided with write buses W, W, read buses R, R, and a read/test circuit 7.

Each bit line pair BL, $\overline{BL}$ is connected to write buses W, $\overline{W}$ via N channel MOS transistors 65, 67 and 66, 68. The gates of transistors 65 and 67 are provided with a writing control signal WC from a clock generator 12 (FIG. 1). The first amplifier 60 is connected to read buses R, R.

The gates of transistors 66, 68 and transistors Q3, Q4 are supplied with a column selecting signal Yi (i=1,2, . . . ) from a column decoder 4. One bit line pair BL, $\overline{BL}$ is selected by one column selecting signal Yi.

In the first differential amplifier 60, transistors Q1 and Q3 are connected in series between read bus R and the ground line. Transistors Q2 and Q4 are connected in series between read bus $\overline{R}$ and the ground line. The gates of transistors Q1 and Q2 are connected to bit lines BL and $\overline{BL}$, respectively.

In read/test circuit 7, a switch 71 is connected between read buses R, R and data buses DB, $\overline{DB}$, and a switch 72 is connected between read buses R, $\overline{R}$ and line test buses LB, $\overline{LB}$. A second differential amplifier 73 is connected to data buses DB, $\overline{DB}$. Second differential amplifier 73 comprises a P channel MOS transistor Q5 connected between the supply terminal and data bus $\overline{DB}$, and a P channel MOS transistor Q6 connected between the supply terminal and data bus DB. The gates of transistors Q5 and Q6 are connected to data bus DB.

An expected data writing circuit 74 is connected to line test buses LB, $\overline{LB}$. Expected data writing circuit 74 is used to write an expected data into line test buses LB and $\overline{LB}$ at the time of line mode testing. An error detection circuit 75 is connected to line test buses LB and $\overline{LB}$. Error detection circuit 75 provides an error flag EF when an error is detected at the time of line mode testing.

Data buses DB, $\overline{DB}$ are connected to output buffer 11 via preamplifier 9 shown in FIG. 1. Error flag EF is supplied to output buffer 11.

Switch 71 becomes conductive by test enable signal $\phi$ at the time of normal operation, and switching 72 becomes conductive by test enable signal $\phi$ at the time of line mode testing.

In the present semiconductor memory device, write buses W, W and read buses R, $\overline{R}$ are separated. This allows high speed access at the time of normal operation. Such a structure is similar to that where the structure disclosed in 1987 VLSI Circuit Symposium pp. 79-80, for example, is applied to the circuit of a MOS transistor.

The operation of the semiconductor memory device of FIGS. 1 and 2 is explained hereinafter.

• Normal Operation

At the time of data writing, one of the plurality of word lines WL is selected by row decoder 3. The potential of the selected word line WL attains a H level. This causes data of H or L to be read out from the memory cell MC connected to the selected word line WL into the corresponding bit line pair BL, $\overline{BL}$. Sense amplifier 50 is then activated by sense amplifier activation signal SA. This results in data of each bit line pair BL, $\overline{BL}$ to be amplified.

Writing control signal WC then attains a H level to turn on transistors 65 and 67. One column selecting signal Yi is selected by column decoder 4, whereby the selected column selecting signal Yi attains a H level. This turns on one pair of transistors 66 and 68 supplied with the selected column selecting signal Yi. This causes data applied to write buses W, $\overline{W}$ to be transferred to one pair of bit lines BL, $\overline{BL}$ corresponding to the selected column selecting signal Yi, whereby the data is written into the selected memory cell MC.

The potential of word line WL then attains a L level. Refresh is carried out in memory cells not selected by column decoder 4 out of all the memory cells connected to the selected word line WL.

At the time of data read out, writing control signal WC is at a L level, whereby write buses W, $\overline{W}$ are disconnected from bit line pair BL, $\overline{BL}$. Therefore, the signals and load of write buses W, $\overline{W}$ do not affect bit line pair BL, $\overline{BL}$.

Figure 3:
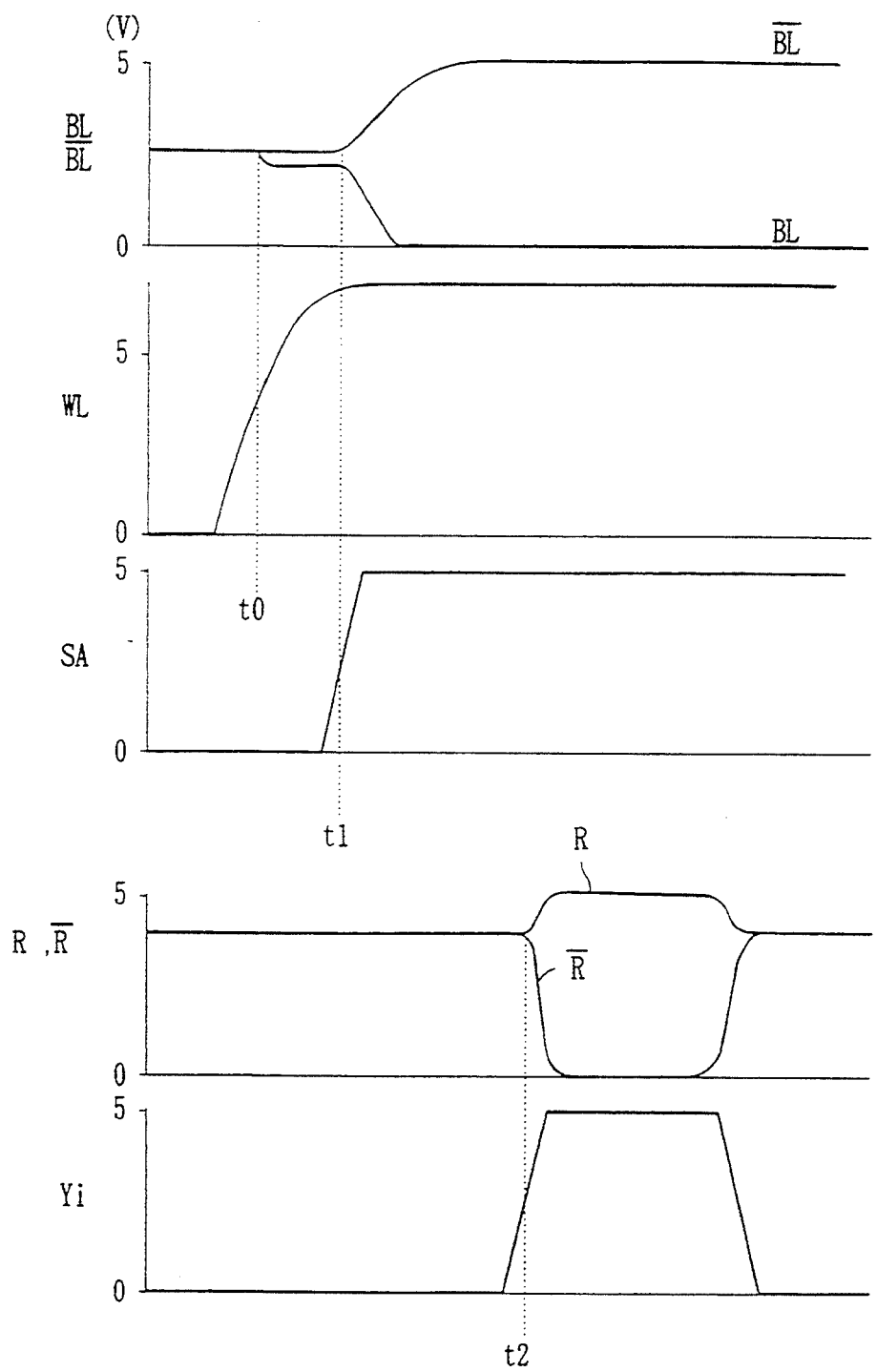
FIG. 3 is a waveform chart for explaining normal operation of the semiconductor memory device of FIG. 1.

Referring to FIG. 3, the potential of the word line WL selected by row decoder 3 at time t0 rises to a H level. The potential of word line WL rises to a level above supply voltage $V_{cc}$ (5V). This causes data to be read out from the memory cells MC connected to the selected word line WL into the corresponding bit line pair BL, $\overline{BL}$. This results in a small potential difference between bit line pair BL and $\overline{BL}$. Sense amplifier activation signal SA attains a H level at time t1 to amplify the small potential difference between bit line pair BL and $\overline{BL}$. This causes the potential of each bit line pair BL and $\overline{BL}$ to attain a H level, and the potential of the other bit line to a L level.

At time t2, column selecting signal Yi selected by column decoder 4 attains a H level. This causes the first differential amplifier 60 corresponding to the selected column selecting signal Yi to operate. The selected first differential amplifier 60 and the second differential amplifier 73 within read/test circuit 7 constitute a current mirror type differential amplifier.

The current mirror type differential amplifier rapidly amplifies the small potential difference between the selected bit line pair BL and $\overline{BL}$ to provide the amplified data to data buses DB, $\overline{DB}$ via read buses R, e,ovs R×. This allows access at high speed.

- Line Mode Test

At the time of writing test data, one of the plurality of word lines WL is selected by row decoder 3, whereby the potential thereof attains a H level. Writing control signal WC attains a H level. At the time of line mode testing, a plurality of column selecting signals are selected simultaneously by column decoder 4.

For example, when the same test data is to be written into all the memory cells MC connected to one word line WL, all the column selecting signals Yi (i=1,2, ... ) are set to a H level. This allows the same data to be written into all the memory cells MC connected to the selected word line WL.

When a test data differing every other memory cell is to be written into the memory cells MC connected to one word line WL, first the column selecting signals Yi (i=1,3, ... ) of an odd number order is set to a H level. This allows a test data of H, for example, applied to write buses W, $\overline{W}$ to be transmitted to the bit line pair BL, $\overline{BL}$ of the odd number order and written into the memory cell MC.

After the column selecting signal Yi of the odd number order (i=1,3, ... ) is brought to a L level, the test data to be applied to write buses W, $\overline{W}$ is inversed. Next, the column selecting signal Yi of an even number order (i=2,4, ... ) is rendered to a H level. This causes the inversed test data of write buses W, $\overline{W}$ to be transmitted to the bit line pair BL, $\overline{BL}$ of the even number order, whereby test data of L is written into memory cell MC. Then, all the column selecting signals Yi (i=1,2, ... ) are brought to a L level.

Thus, test data differing every 1 bit (H, L, H, L, ... ) is written.

When a test data differing every two bits is to be written into the memory cells MC connected to one word line WL, the column selecting signal is rendered to a H level for every 2 bits, and test data of H, for example, is written into the corresponding bit line pair BL, $\overline{BL}$. Then these column selecting signals are pulled to a L level, and inverse test data is to be written. Next, the remaining column selecting signals are brought to a H level, and test data of L is written into the corresponding bit line pair BL, $\overline{BL}$. Thus, test data differing every 2 bits (H, H, L, L, ... ) is written. Finally, all the column selecting signals Yi (i=1,2, ... ) are brought to a L level.

When writing of test data related to one word line WL is completed, the potential of that word line WL drops to a L level. Then, the next word line WL is selected to repeat the above described operation.

Thus, test data is written in a short time by using word line WL, column selecting signal Yi and write buses W, $\overline{W}$. In the case of a 1M bit memory array, for example, the writing time is reduced to approximately 1/1000 of a conventional writing time.

Referring to FIG. 5, the operation of writing a checker board field pattern into memory array 1 is described hereinafter.

It is assumed that X address WL1, WL2, ... corresponds to word line WL, and Y address BL1, BL2, ... corresponds to bit line pair BL, $\overline{BL}$.

After the first word line WL is selected, test data of H is applied to write buses W, $\overline{W}$. Column selecting signal Yi of an odd number order rises to a H level, whereby test data is written into the memory cells MC connected to the selected word line WL. Then, column selecting signal Yi of the odd number order falls to a L level.

Next, test data of write buses W, $\overline{W}$ is inversed to a L level. Column selecting signal Yi of the even number order rises to a H level, whereby test data is written into the memory cells MC connected to the selected word line WL.

Then, the potential of the first word line WL falls to a L level, whereby test data of H, L, H, L, ... is written into X address WL1.

Next, the second word line WL is selected, whereby test data of L is written when column selecting signal Yi of the odd number order is selected, and a test data of H is written when column selecting signal Yi of the even number order is selected. By repeating this operation, the checker board field pattern of FIG. 5 is written.

At the time of test data read out, the writing control signal WC is at a L level. Therefore, the bit line pair BL, $\overline{BL}$ is not affected by the signals and load of write buses W, $\overline{W}$. Read buses R, $\overline{R}$ are connected to line test buses LB, $\overline{LB}$ via switch 72 of read/test circuit 7.

Figure 4:
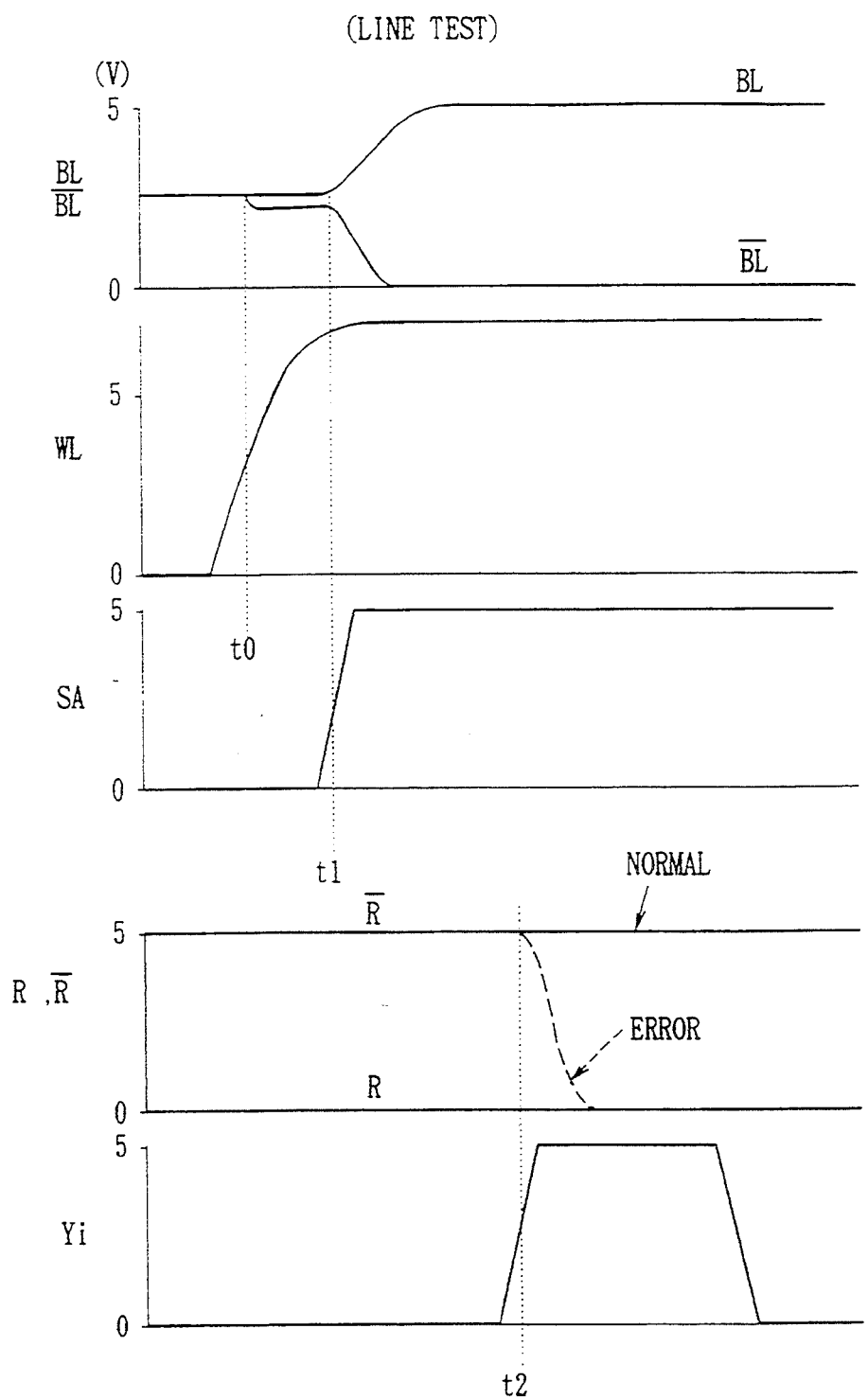
FIG. 4 is a waveform chart for explaining line mode testing of the semiconductor memory device of FIG. 1.

The read out operation is described in the case where the field pattern of FIG. 5 is written. Referring to FIG. 4, the potential of the selected word line WL rises to a H level at time t0. This causes test data in the memory cells MC connected to that word line WL to be read out into the corresponding bit line pairs BL, $\overline{BL}$. Sense amplifier activation signal SA rises to a H level at time t1 to activate sense amplifier 50. As a result, the small potential difference between each bit line pair BL, $\overline{BL}$ is amplified.

Prior to the rise of column selecting signal Yi of the odd number order to a H level, an expected data of L is applied to read buses R, $\overline{R}$ by expected data writing circuit 74 of read/test circuit 7.

Because test data of H is read into bit line pairs BL, $\overline{BL}$ of the odd number order, the potentials of bit lines BL and $\overline{BL}$ attain a H level and a L level, respectively. Accordingly, the first differential amplifier 60 connected to read buses R, $\overline{R}$ have transistor Q1 turned on and transistor Q2 turned off.

Under this condition, at time t2, column selecting signal Yi of the odd number order rises to a H level. This causes the first differential amplifier 60 connected to read buses R, $\overline{R}$ to have transistors Q3 and Q4 turned on, and have read bus R connected to the ground line via transistors Q1 and Q3. Because the potential of read bus R is precharged to a L level, there is no particular change in potential. Read bus $\overline{R}$ is not discharged and the potential thereof is maintained at the precharged H level since transistor Q2 is turned off (refer to FIG. 4). The foregoing is a description of test data of the bit line pair BL, $\overline{BL}$ of the odd number order read out correctly.

Assume that there is an error in one of the bit line pairs BL, $\overline{BL}$ of the odd number order. The potential of bit line $\overline{BL}$ that should be at a L level is at a H level or an intermediate level. Therefore, transistor Q2 that should be turned off is turned on. As a result, read bus R that should be held at a H level at the time of normal operation is discharged to a L level through transistors Q2 and Q4, as shown in the broken lines of FIG. 4.

If there is at least one erroneous data in the test data read out on the bit line pairs BL, $\overline{BL}$ of the odd number order, the potentials of read buses R and $\overline{R}$ both attain a L level, and the potentials of line test buses LB and $\overline{LB}$ both attain a L level. As a result, error flag EF is provided from error detection circuit 75 to end the testing.

If all the test data read out to bit line pairs BL, $\overline{BL}$ of the odd number order are correct, an error flag EF is not provided from error detection circuit 75 in read/test circuit 7. In this case, testing of bit line pairs BL, $\overline{BL}$ of the even number order is carried out.

First, expected data writing circuit 74 of read/test circuit 7 provides an expected data of H to read buses R, R, before column selecting signal Yi of the even number order rises to a H level.

When all the test data of bit line pairs BL, $\overline{BL}$ of the even number order are read out correctly, test data of L is read out on the bit line pair BL, $\overline{BL}$ of the even number order. Therefore, the potential of bit line BL attains a L level, and the potential of bit line $\overline{BL}$ attains a H level. As a result, the potential of read bus R remains at a H level and the potential of read bus $\overline{R}$ remains at a L level, even if column selecting signal Yi of the even number order rises to a H level.

If there is at least one error in the bit line pairs BL, $\overline{BL}$ of the even number order, the potential of bit line BL that should be at a L level is at a H level or an intermediate level. This causes read bus R to be discharged to a L level.

If there is at least one erroneous data in the test data read out to bit line pairs BL, $\overline{BL}$ of the even number order, the potentials of read buses R, $\overline{R}$ both attain a L level, and the potentials of line test buses LB, $\overline{LB}$ both attain a L level. As a result, error detection circuit 75 provides an error flag EF to end the testing.

An error flag EF is not provided from error detection circuit 75 in read/test circuit 7 when all the test data read out to bit line pairs BL, $\overline{BL}$ of the even number order are correct.

When test data stored in memory cells MC connected to the first word line WL are all read out correctly, an error flag EF is not provided from read/test circuit 7. Then, the potential of word line WL falls to a L level.

With the above described two cycles of reading operation, testing of one row of memory cells MC of the first word line WL is performed. Then, the above operation is repeated in sequence for the second word line, the third word line, . . .

If an error flag EF is not provided when the line mode testing of all word lines is completed, data in all memory cells MC are read out correctly, and the chip is regarded to "pass" the testing.

Figure 6:
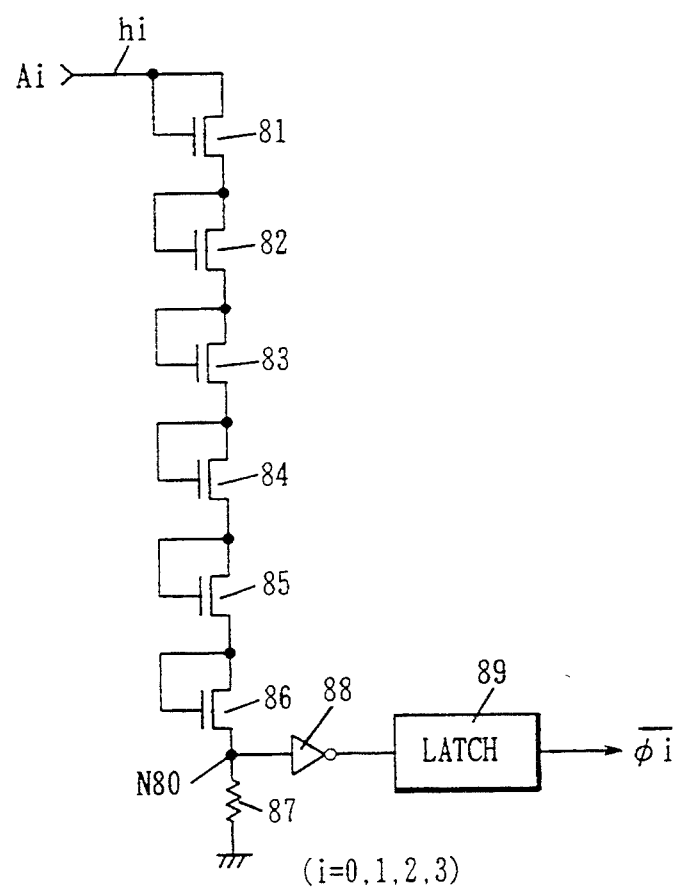
FIG. 6 is a circuit diagram of a structure of a high-voltage detector.

FIG. 6 is a circuit diagram of a structure of high-voltage detectors 8a–8d of the semiconductor memory device of FIG. 1.

N channel MOS transistors 81–86 are connected between input terminal hi for address signal Ai and node N80. A resister 87 is connected between node N80 and the ground line. i indicates 0, 1, 2, 3. Node N80 is connected to latch circuit 89 via inverter 88.

The threshold voltages of transistors 81–86 are set to a 0V and the threshold voltage of inverter 88 is set to ½ of supply voltage $V_{cc}$, for example. If supply voltage $V_{cc}$ is 5V, the threshold voltage of inverter 88 is 2.5V.

By applying a voltage of 10V to input terminal hi, a voltage reduced by 6V, i.e. 4V appears at node N80. Inverter 88 will regard the signal of node N80 as a H level to provide a voltage of L level.

Since input terminal hi is used to apply address signal Ai, the output of inverter 88 is latched by latch circuit 89. The output signal of latch circuit 89 is used as signal $\phi i$.

At the time of normal operation, address signal Ai of 0V–7V is applied to input terminal hi. When an address signal Ai of 7V is applied to input terminal hi, a voltage of 1V is generated at node N80. This voltage is determined as a L level by inverter 88 to render signal $\phi i$ to a H level.

Figure 7:
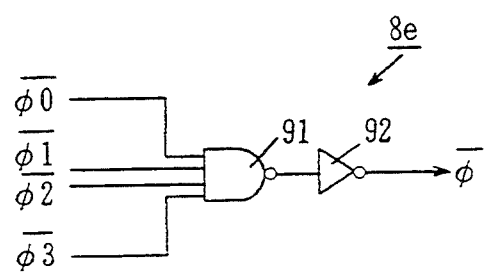
FIG. 7 is a circuit diagram showing a structure of a $\phi$ generating circuit.

FIG. 7 is a circuit diagram showing the structure of a $\phi$ generating circuit 8e of the semiconductor memory device of FIG. 1.

$\phi$ generating circuit 8e comprises a NAND gate 91 and an inverter 92. The input terminal of NAND gate 91 is supplied with signals $\phi 0$–$\phi 3$ from high-voltage detectors 8a–8e. When at least one of signals $\phi 0$–$\phi 3$ is at a L level, test enable signal $\phi$ provided from inverter 92 attains a L level.

Figure 8:
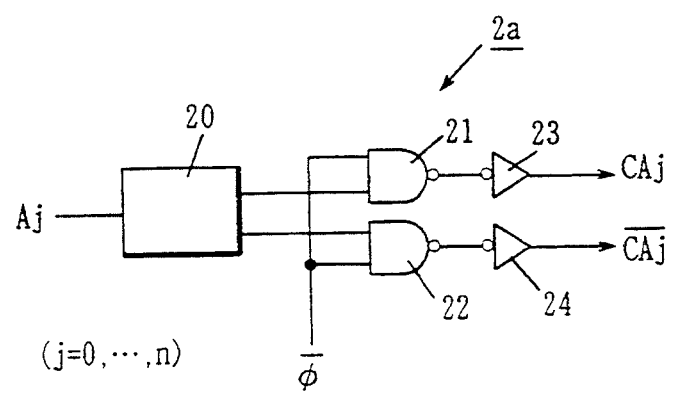
FIG. 8 is a diagram showing a structure of a column address buffer.

FIG. 8 is a block diagram showing the structure of a part of column address buffer 2a included in address buffer 2 of the semiconductor memory device of FIG. 1.

Column address buffer 2a comprises complementary signal generating circuit 20, NAND gates 21, 22, and inverters 23, 24. Complementary signal generating circuit 20 receives address signal Aj to generate signals complementary to each other. j indicates 0-n. One input terminal of NAND gates 21 and 22 are supplied with test enable signal $\phi$.

When test enable signal $\phi$ is at a H level, complementary column address signals CAj, $\overline{CAj}$ are provided from inverters 23 and 24. When test enable signal $\phi$ is at a L level, column address signals CAj and $\overline{CAj}$ both attain a L level.

Figure 9:
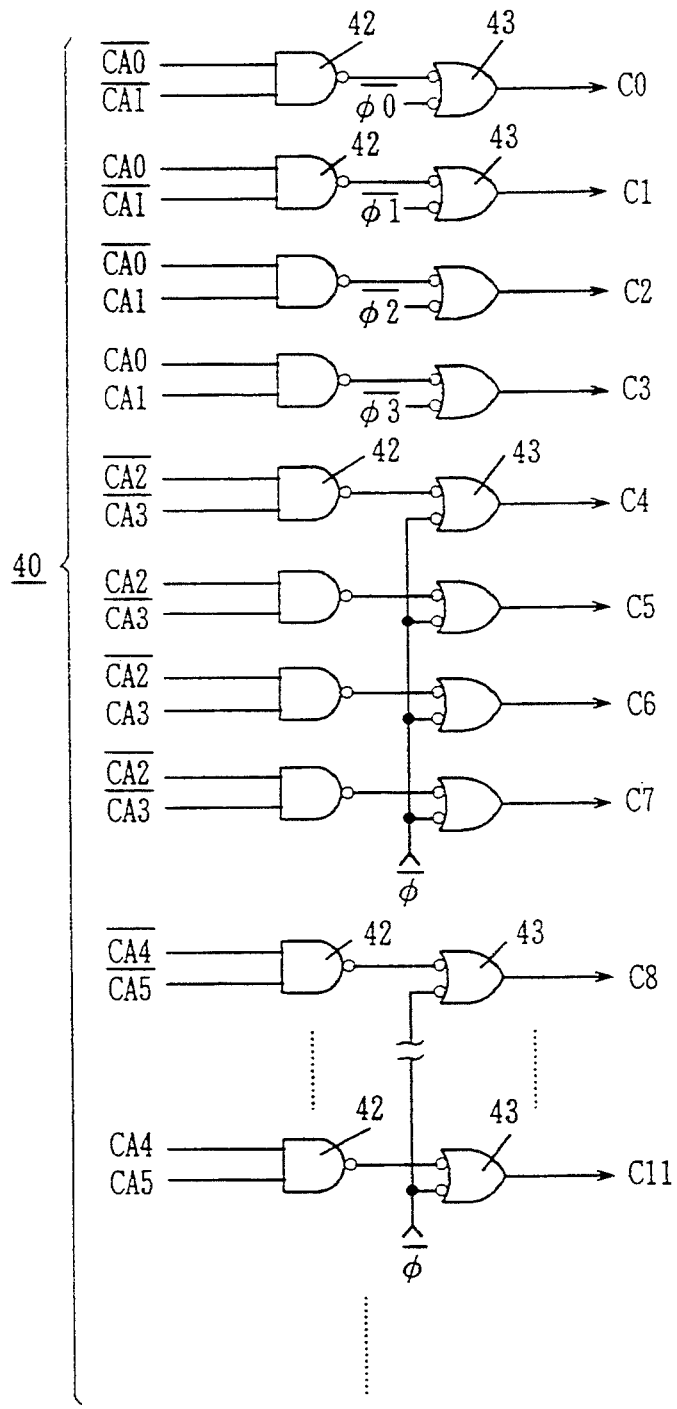
FIG. 9 is a circuit diagram of a structure of a column predecoder.
Figure 10:
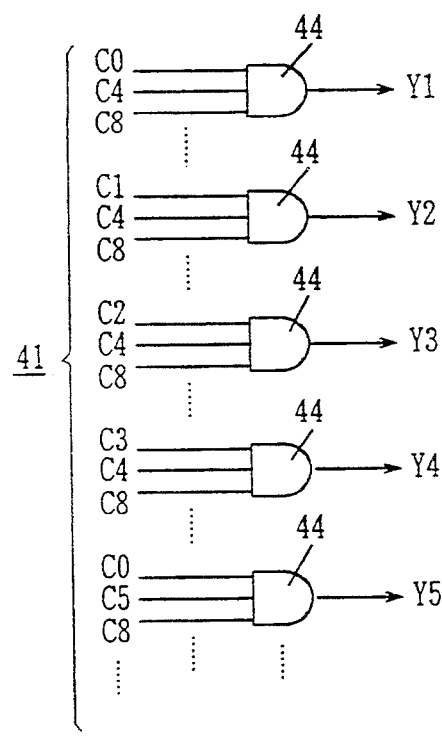
FIG. 10 is a circuit diagram of a structure of a column main decoder.

FIGS. 9 and 10 are circuit diagrams showing the structure of column decoder 4 of the semiconductor memory device of FIG. 1. Column decoder 4 comprises column predecoder 40 of FIG. 9 and column main decoder 41 of FIG. 10.

Column predecoder 40 comprises a plurality of NAND gates 42 and a plurality of NAND gates 43.

Each NAND gate 42 is provided with two arbitrary column address signals CA0, $\overline{CA0}$-CAn, $\overline{CAn}$.

One input terminal of NAND gate 43 related with column address signals CA0, $\overline{CA0}$, CA1, $\overline{CA1}$ are provided with signals $\phi 0$–$\phi 3$, respectively. Signals C0, C1, C2, . . . are provided from NAND gate 43.

When signals $\phi 0$–$\phi 3$ and test enable signal $\phi$ are all at a H level, column predecoder 40 responds to the applied column address signal to turn one of signals C0–C3, one of signals C4–C7, and one of signals C8–C11 respectively to a H level.

When test enable signal $\phi$ is at a L level, signals C4–C11 all attain an H level. Corresponding to the signals of the H level in signals $\phi 0$–$\phi 3$, all or any of signals C0–C3 attain a H level.

Column main decoder 41 comprises a plurality of AND gates 44. Column main decoder 41 responds to signals C0, C1, C2, . . . to bring one or a plurality of column selecting signals Y1, Y2, Y3, . . . to a H level.

When test enable signal $\phi$ and signals $\phi 0$, $\phi 2$ are at a L level, and signals $\phi 1$, $\phi 3$ are at a H level, or when test enable signal $\phi$ and signals $\phi 1$, $\phi 3$ are at a L level and signals $\phi 0$, $\phi 2$ are at a H level, column selecting signal Yi is selected by every 1 bit.

When test enable signal $\phi$ and signals $\phi 0$, $\phi 1$ are at a L level and signals $\phi 2$, $\phi 3$ are at a H level, or when test enable signal $\phi$ and signals $\phi 2$, $\phi 3$ are at a L level and signals $\phi 0$, $\phi 1$ are at a H level, column selecting signal Yi is selected for every 2 bits.

When test enable signal $\phi$ is at a L level, one of signals $\phi 0$, $\phi 3$ is at a L level, and the remaining are at a H level, column selecting signal Yi is selected for every 4 bits.

When test enable signal $\phi$ and signals $\phi 0$, $\phi 3$ are all at a L level, all column selecting signals Yi are selected.

Figure 11:
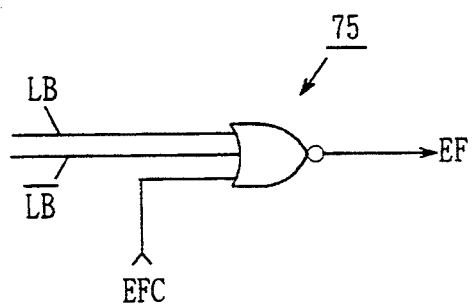

FIG. 11 is a structure of an error detection circuit 75 of FIG. 2.

Error detection circuit 75 is implemented with a 3-input NOR gate. NOR gate has the first input terminal connected to line test bus LB, and the second input terminal connected to line test bus $\overline{LB}$. The third input terminal is supplied with an error flag control signal EFC. Error flag control signal EFC attains a L level only when error checking is carried out in line mode testing. An error flag EF of a H level is provided from NOR gate 75 when an error is detected.

Figure 12:
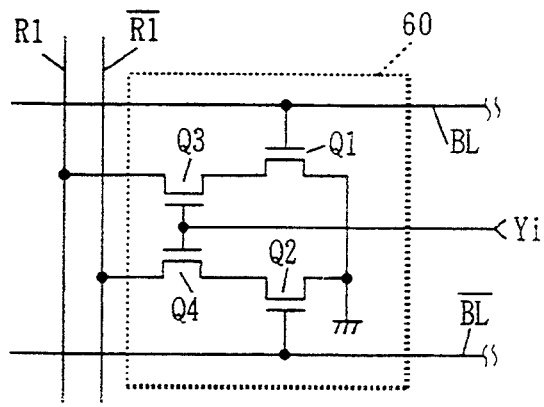
FIG. 12 is a circuit diagram showing a structure of an error detection circuit.

FIG. 12 is a circuit diagram of another example of the first differential amplifier 60. In comparison with the first differential amplifier 60 of FIG. 2, the positions of transistors Q1 and Q2 connected to bit line pair BL, $\overline{BL}$, and transistors Q3, Q4 receiving column selecting signal Yi are replaced with each other. According to the structure of FIG. 12, column selecting signal Yi can be rendered to a H level, after the voltage amplitude between bit line pair BL, $\overline{BL}$ is large enough at the time of normal operation. It is therefore possible to rapidly drop one potential of read buses R1 or $\overline{R1}$ to a L level according to relating stray capacitance.

Figure 13:
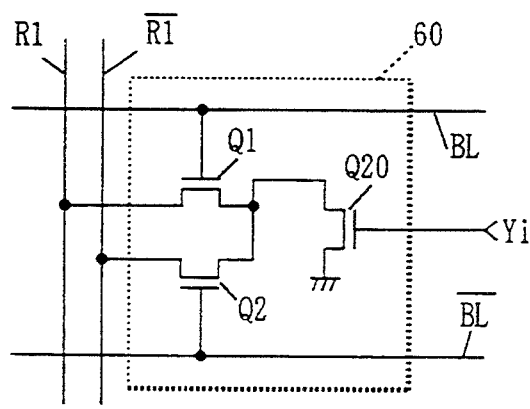
FIG. 13 is a circuit diagram showing another example of a first differential amplifier.

FIG. 13 is a circuit diagram showing a further example of the first differential amplifier 60. In comparison with the first differential amplifier 60 of FIG. 2, one transistor Q20 is used instead of the two transistors Q3, Q4 receiving the column selecting signal Yi. This means that the number of devices is reduced. However, if there is fault in bit line pair BL, $\overline{BL}$ so that bit line BL and bit line $\overline{BL}$ are short-circuited, both transistors Q1 and Q2 are turned on, whereby read buses R1 and $\overline{R1}$ are connected to each other via transistor Q1 and Q2. It will become impossible to carry out line mode testing even if the faulty bit line pair BL, $\overline{BL}$ is replaced by a redundant circuit.

Figure 14:
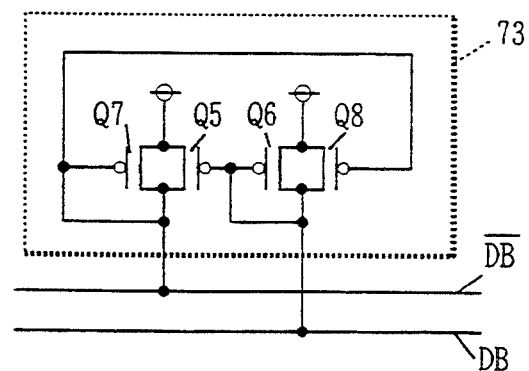
FIG. 14 a circuit diagram showing another example of a second differential amplifier.

FIG. 14 is circuit diagram showing another example of the second differential amplifier 73. This second differential amplifier 73 is called a symmetric type differential amplifier.

This second differential amplifier 73 is additionally provided with a P channel MOS transistor Q7 connected in parallel with transistor Q5, and a P channel MOS transistor Q8 connected in parallel with transistor Q6. This can improve the operation characteristic during normal operation, as will be described later on.

Figure 15:
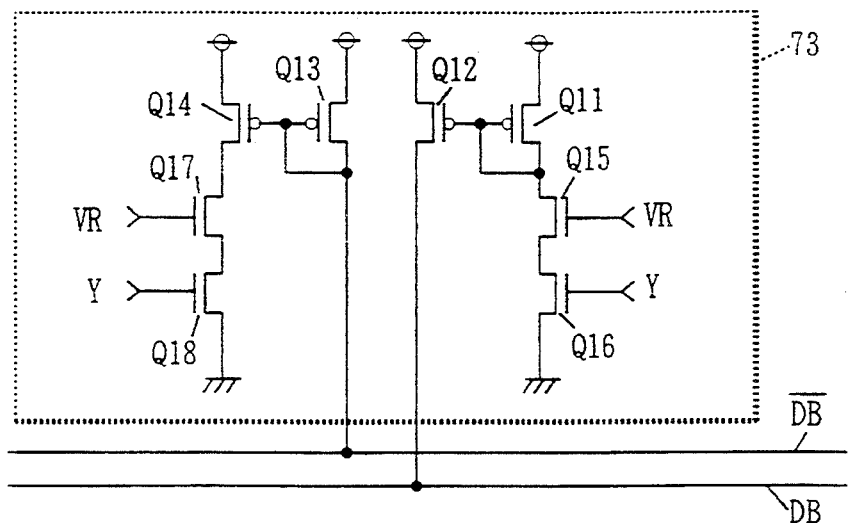
FIG. 15 is a circuit diagram showing a further example of a second differential amplifier.

FIG. 15 is a circuit diagram showing another example of the second differential amplifier 73. This second differential amplifier 73 is called a double differential amplifier.

The second differential amplifier 73 of FIG. 15 is constituted by a first differential amplifier comprising P channel MOS transistors Q11, Q12 and N channel MOS transistors Q15 and Q16, and a second differential amplifier comprising P channel MOS transistors Q13, Q14 and N channel MOS transistors Q17, and Q18. The first differential amplifier is connected to data bus DB, and the second differential amplifier is connected to data bus $\overline{DB}$.

The gates of transistors Q15 and Q17 are supplied with a reference voltage VR. Reference voltage VR is set to $\frac{1}{2}$ of supply voltage $V_{cc}$. The gates of transistors Q16 and Q18 are supplied with activation signal Y. Activation signal Y is brought to a H level when one of column selecting signals Yi attains a H level. According to the structure of FIG. 15, sensitivity rises to improve the operation characteristic of normal operation.

Figure 16:
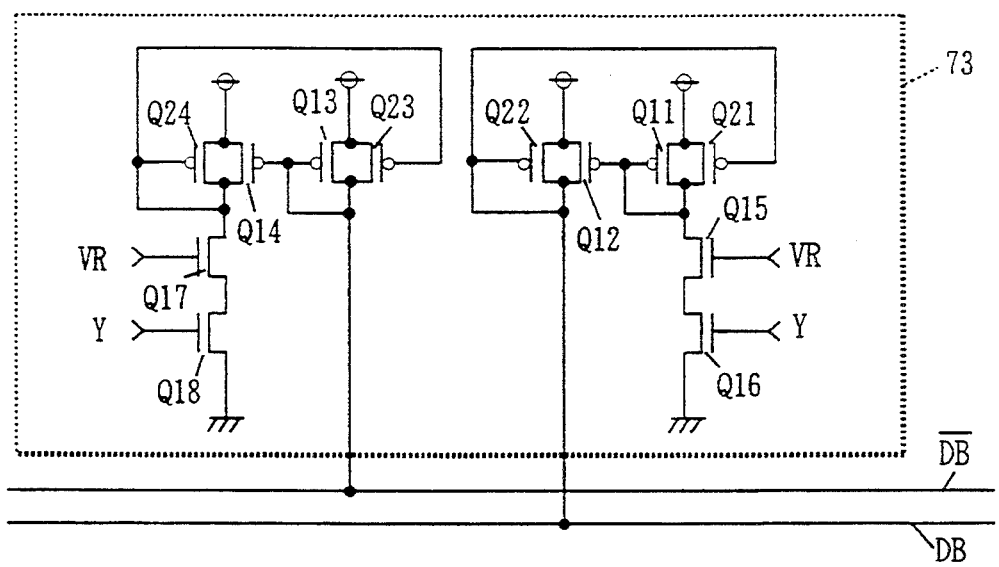
FIG. 16 is a circuit diagram showing a still further example of a second differential amplifier FIG. 17AK is a diagram of a structure of an asymmetric type differential amplifier.

FIG. 16 is a circuit diagram showing a still further example of the second differential amplifier 73. The differential amplifier 73 of FIG. 16 is a combination of the symmetric type differential amplifier of FIG. 14 and the double differential amplifier of FIG. 15. This second differential amplifier 73 is called a double symmetric type differential amplifier.

In comparison with the second differential amplifier 73 of FIG. 15, P channel MOS transistors Q21–Q24 are provided additionally.

According to this structure, the advantages of both the symmetric type differential amplifier and the double differential amplifier are obtained.

The difference in characteristics between an asymmetric differential amplifier and a symmetric type differential amplifier will be described hereinafter.

Figure 17:
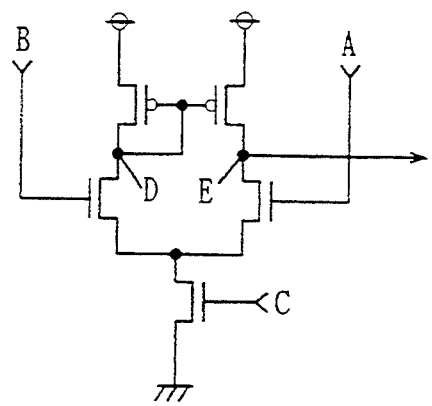
FIG. 17B is a waveform chart for explaining the characteristic of an asymmetric type differential amplifier.
Figure 17:
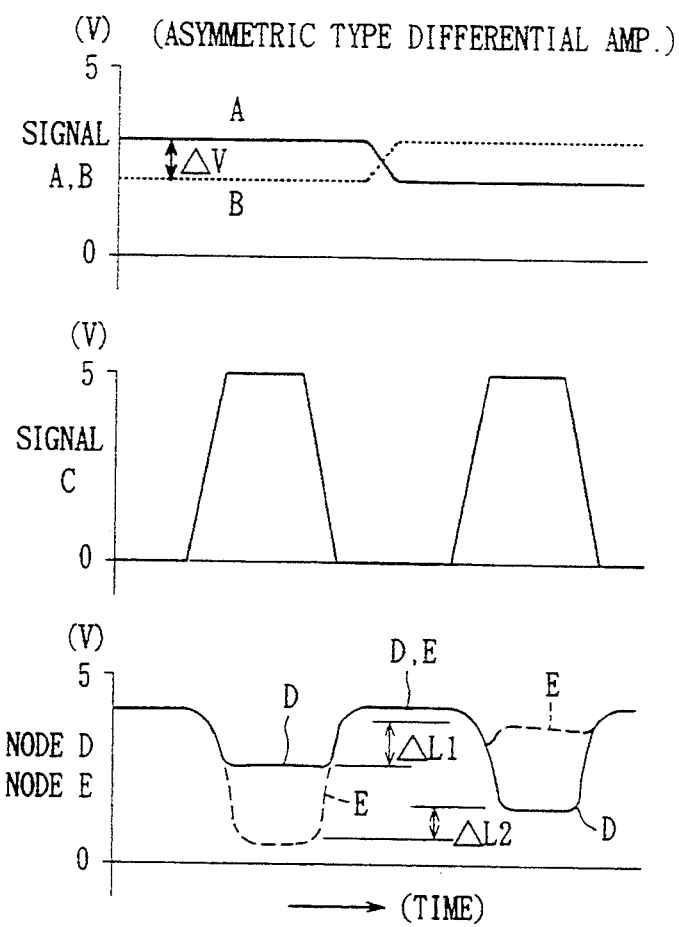

FIG. 17A shows a structure, and FIG. 17B shows a waveform chart of an asymmetric differential amplifier.

Figure 18:
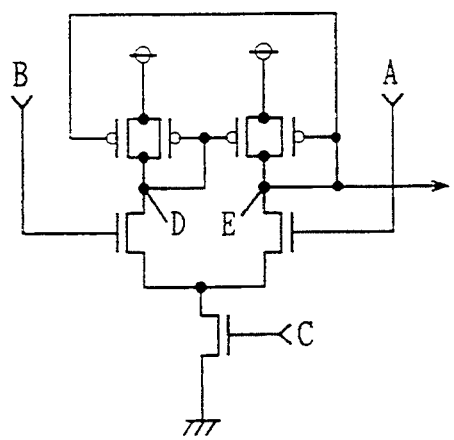
FIG. 18A is a diagram of a structure of a symmetric type differential amplifier.
FIG. 18B is a waveform chart for explaining the characteristic of a symmetric type differential amplifier.
Figure 18:
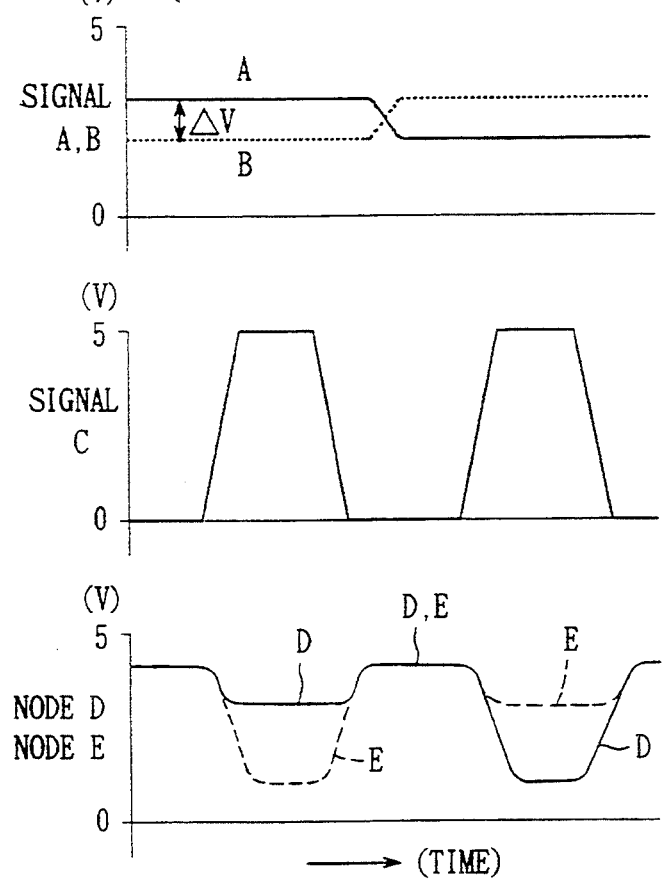

FIG. 18A shows a structure, and FIG. 18B shows a waveform chart of a symmetric differential amplifier.

The characteristics will be compared when activation signal C becomes H with a potential difference of V between signal A and signal B. In the asymmetric type differential amplifier, there is a potential difference of L1 between a H level potential of node D and a H level potential of node E, and a potential difference of L2 between a L level potential of node E and a L level potential of node D. In the symmetric type differential amplifier, there is no potential difference between the H level potential of node D and the H level potential of node E, and between the L level potential of node E and the L level potential of node D.

Testing by field patterns and march testing will be explained hereinafter.

Various examples of field patterns are shown in FIGS. 19–24. FIG. 19 is a row stripe field pattern, FIG. 20 is a checker pattern board field pattern, FIG. 21 a 2-row stripe field pattern, FIG. 22 is a 2-column checker pattern, FIG. 23 is a double checker field pattern, and FIG. 24 is a column stripe field pattern.

Field pattern testing is carried out by writing test data according to the field pattern into a memory array, followed by reading out the test data therefrom.

Operational margins such as interference between memory cells, noise between word lines, noise between bit lines, noise between sense amplifiers can be checked by field pattern testing.

The above embodiment allows line mode testing using the various field patterns of FIGS. 19-24 by selecting appropriate column selecting signal Yi.

In testing by field patterns, there is a possibility that error in an address system, for example, may not be detected because the patterns exist in a periodic manner. In such a case, it is necessary to carry out the next march testing.

Figure 25:
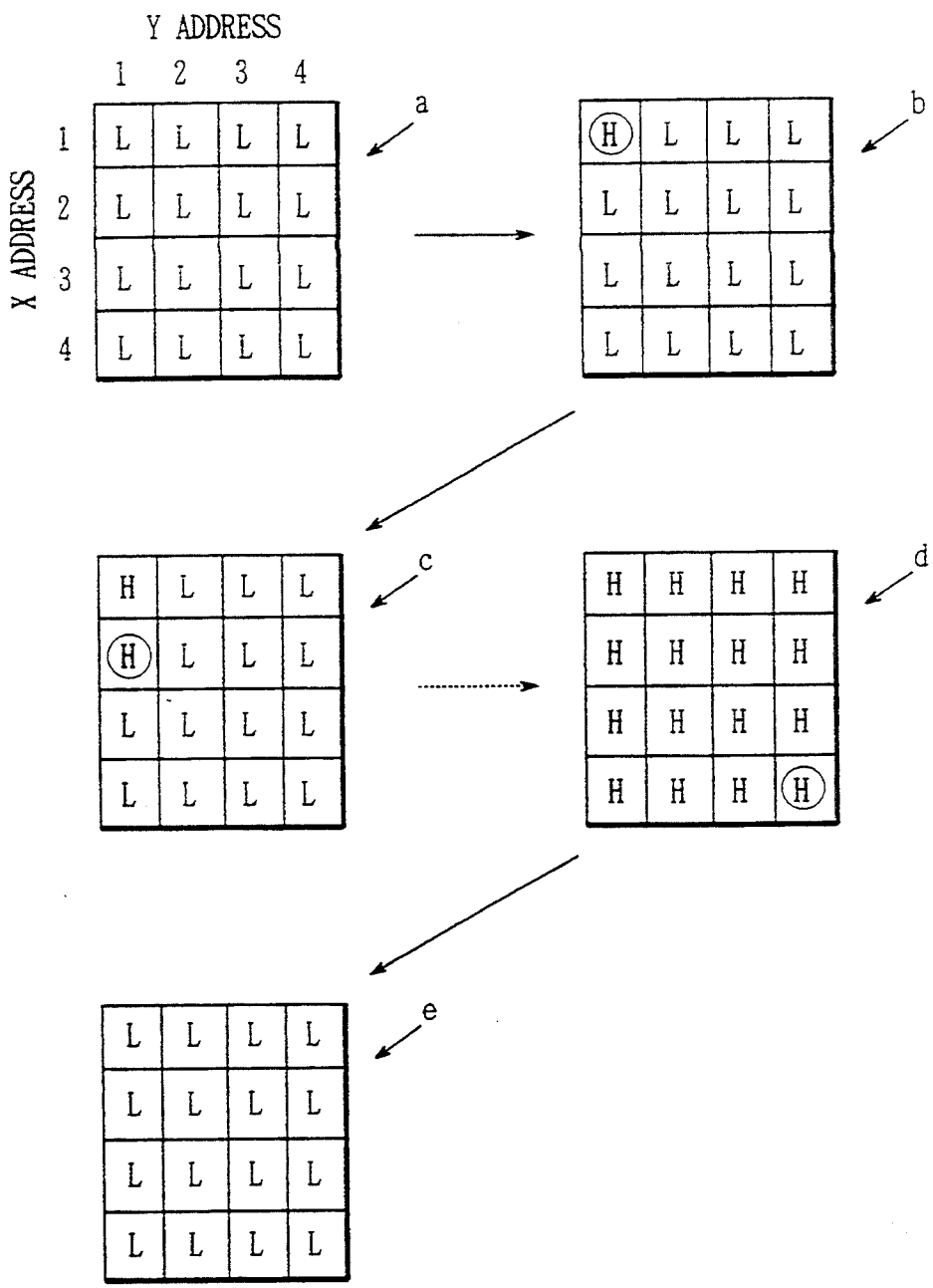
FIG. 25 is a model diagram for explaining a march test.

FIG. 25 is a diagram for explaining the march test.

An example of a march test of a 4×4(=16) bit-memory array is shown in FIG. 25.

In a, test data of L is written into all addresses as the background data.

In b, test data of L is read out from X address 1 and Y address 1, and test data of H is written into the same addresses.

In c, test data of L is read out from X address 2 and Y address 1, and test data of H is written into the same addresses.

The address of X address is sequentially increased and the above operation is repeated. When the above operation is completed for the 4 addresses of X address, the address of Y address is increased by 1 and the above operation is repeated while the address of X address is increased by 1 sequentially.

In d, test data of L is read out from X address 4 and Y address 4, and test data of H is written into the same addresses.

Increasing the addresses of X address and Y address as in the above manner, test data of H is read out and test data of L is written. This is repeated for all addresses.

Test data of L is written into all addresses as shown in e. Then, test data of L of all the addresses are read out.

An operation similar to the above operation is carried out decreasing the addresses of X address and Y address.

This march test is necessary to examine whether addresses are selected correctly.

In the semiconductor memory device of the above mentioned embodiment, a test similar to the march test can be carried out. This pseudo march test is described with reference to FIG. 26 that can be carried out according to the above embodiment.

Figure 26:
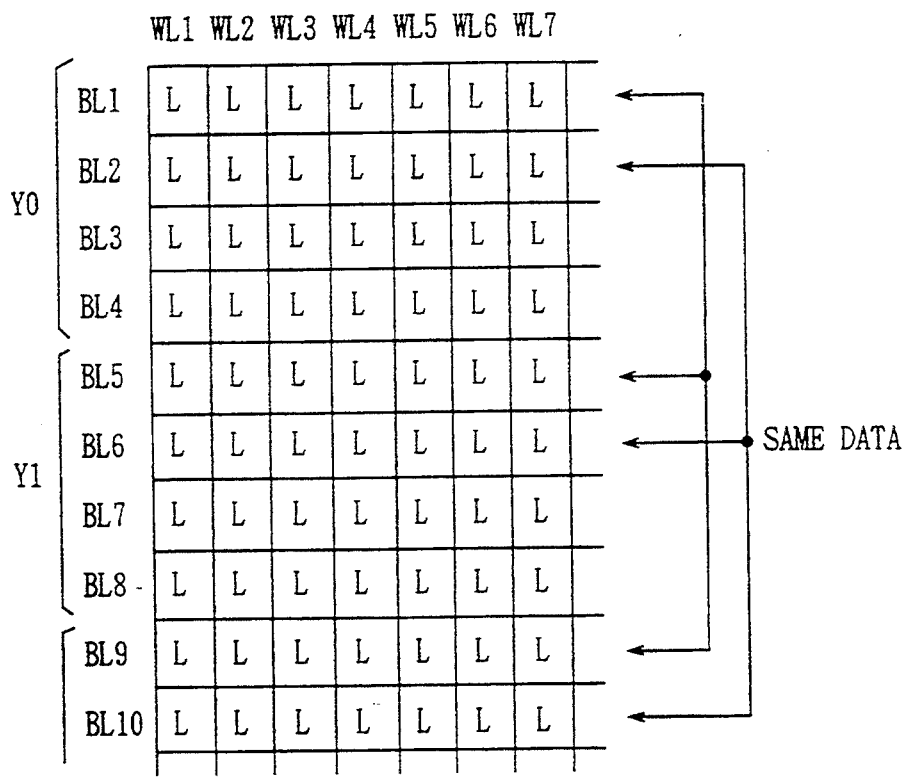
FIG. 26 is a model diagram for explaining a pseudo march test.

Referring to FIG. 26, reading and writing of the same test data is carried out for every 4 bits of Y address. It is necessary to differentiate the test data within the four addresses of Y address selected at the same time.

After test data of L is written into all addresses, X address WL1 is selected. Expected data of L is applied to Y addresses BL1-BL10, followed by reading out test data of L from those addresses. Next, test data of H is written to only Y addresses BL1, BL5 and BL9, and test data of L is written into Y addresses BL2-BL4, BL6-BL8, BL10.

After increasing the X address, the above described reading and writing operation is carried out. When this operation is completed with the last X address, X address is returned to WL1. Expected data of H is applied to Y addresses BL1, BL5 and BL9, and expected data of L is applied to Y addresses BL2-BL4, BL6-BL8 and BL10. Test data is read out from these addresses. Then, test data of H is written into Y addresses BL1, BL2, BL5, BL6, BL9, and BL10, and test data of L is written into Y addresses BL3, BL4, BL7 and BL8.

X address is increased, and the above read and write operations are repeated.

Similarly, expected data of H is applied to Y addresses BL1, BL2, BL5, BL6, BL9, BL10, and expected data of L is written into Y addresses BL3, BL4, BL7, BL8. Test data is read out from these addresses. A test locally equal to a march test can be carried out in the above manner.

Thus, testing time can be reduced significantly even in pseudo march test which was not effective in conventional line mode testing using a plurality of latch circuits.

Figure 27:
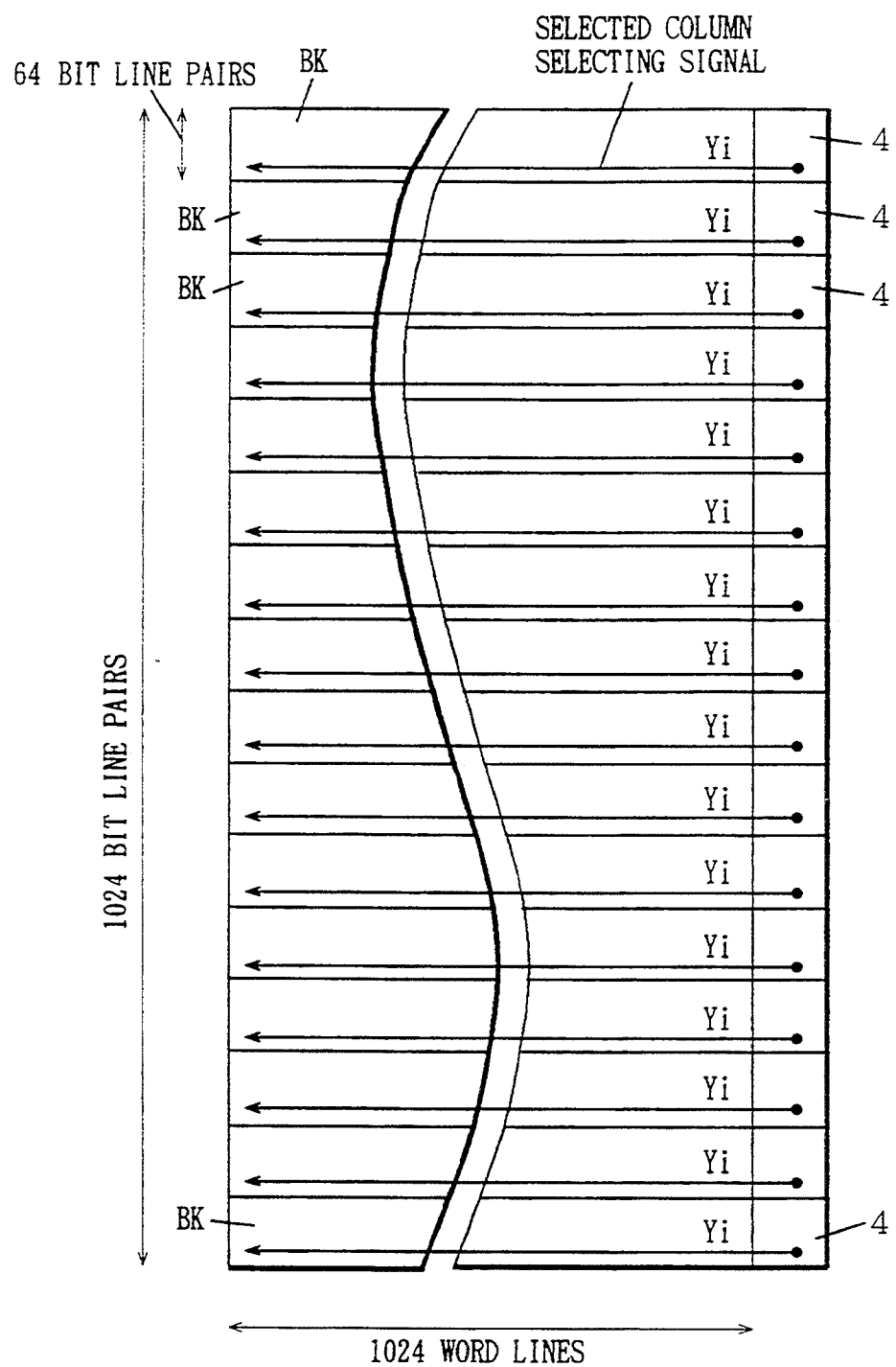
FIGS. 27 and 28 are model diagrams showing a memory array divided into a plurality of block arrays.
Figure 28:
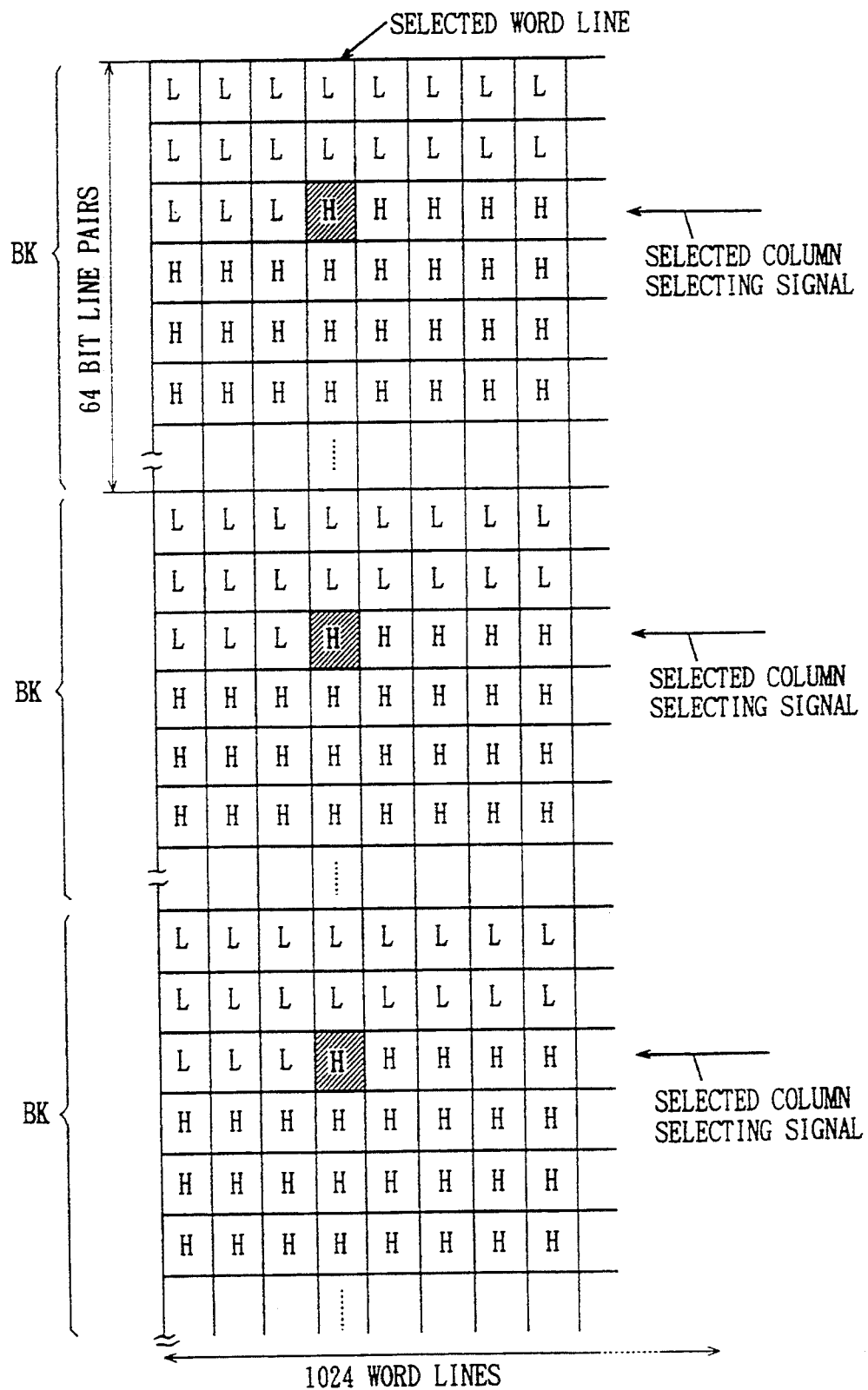

FIGS. 27 and 28 show an example where a memory array is divided into 16 block arrays BK.

The memory array comprises 1024 bit line pairs and 1024 word lines, with a capacity of 1M bit. Each block array BK comprises 64 bit line pairs. One column selecting signal Yi is activated within one block array BK. Therefore sixteen memory cells can be tested simultaneously. The testing of all the memory array is completed by carrying out a march test in each block array BK. Thus the march testing time can be reduced to 1/16.

Figure 29:
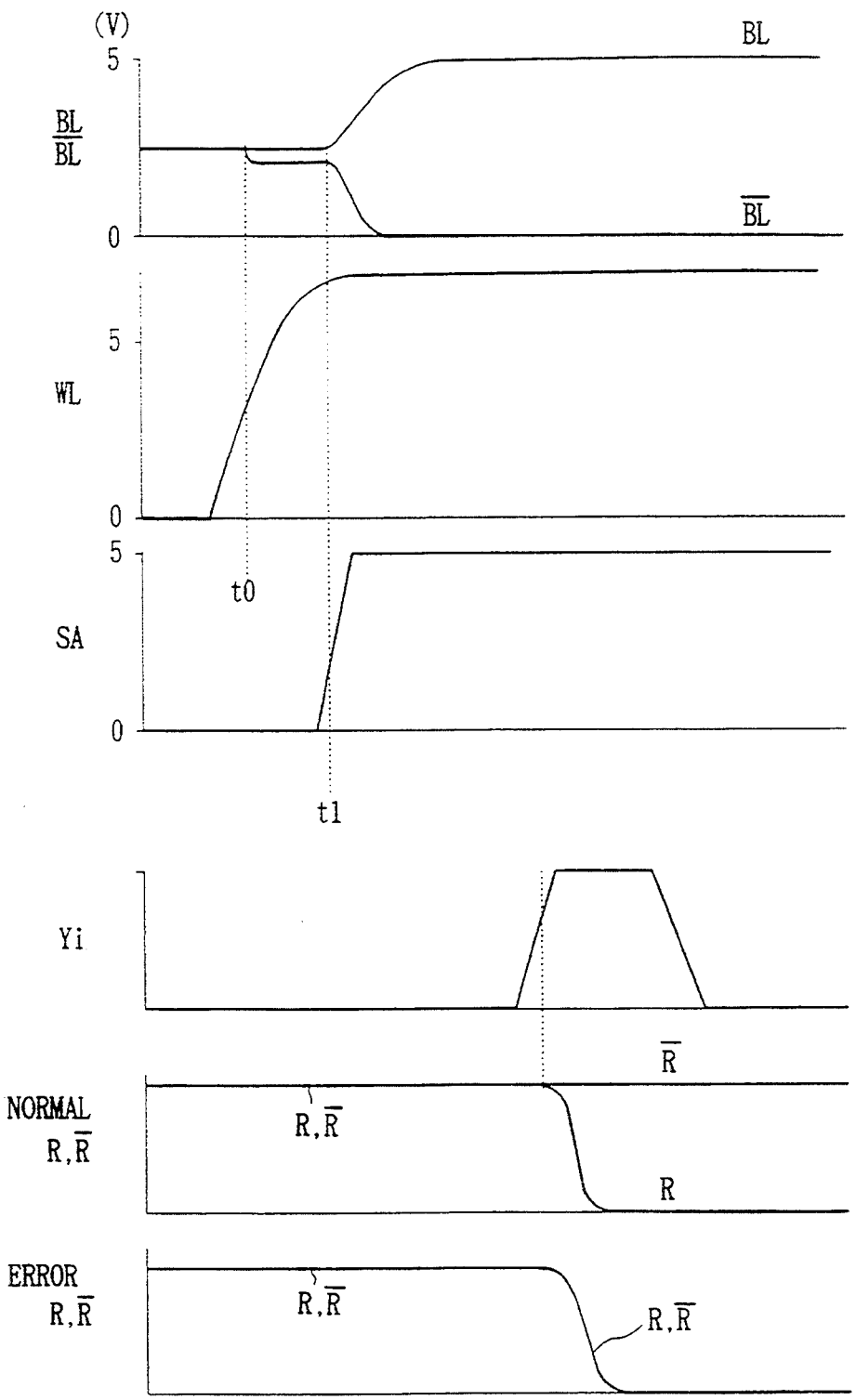
FIG. 29 is a waveform chart for explaining other operations of the semiconductor memory device of FIGS. 1 and 2.

Referring to FIG. 29, other operations of the semiconductor memory device of FIGS. 1 and 2 will be explained hereinafter.

Read buses R, $\overline{R}$ are precharged to the H level. For example, if a H test data is properly read into all the bit line pairs BL, $\overline{BL}$ of the odd number order, each first differential amplifier 60 connected to read buses R, $\overline{R}$ have transistor Q1 thereof turned on and transistor Q2 thereof turned off. When all of the column selecting signals Yi rise to the H level, read bus $\overline{R}$ is discharged to the L level, and read bus R is not discharged, so that the potential thereof is maintained at the H level.

If there is an error in one of the bit line pairs BL, $\overline{BL}$ of the odd number order, for example, the potential of bit line $\overline{BL}$ that should be at the L level attains the H level or an intermediate level. Therefore transistor Q2 that should be turned off is ON. This causes both read buses R, $\overline{R}$ to be discharged to the L level.

It is detected that all data are read out properly when a plurality of data read out simultaneously all matched each other. It is detected that there is an error when any of the plurality of data read out simultaneously does not match the other data.

Read buses R, $\overline{R}$ are supplied with a data corresponding to the data to be read out, as an expected data. It is necessary to know in advance whether the data stored in each address is H or L in order to determine the expected data. It is also necessary to write the expected data corresponding to each address into the read bus. As a result, the test operation becomes complicated.

In the above method, only the information that the same data is stored for every other memory cell is required in advance. It is not necessary to provide the expected data to the read bus by the expected data writing circuit 74. As a result, it is possible to carry out testing easily.

Figure 30:
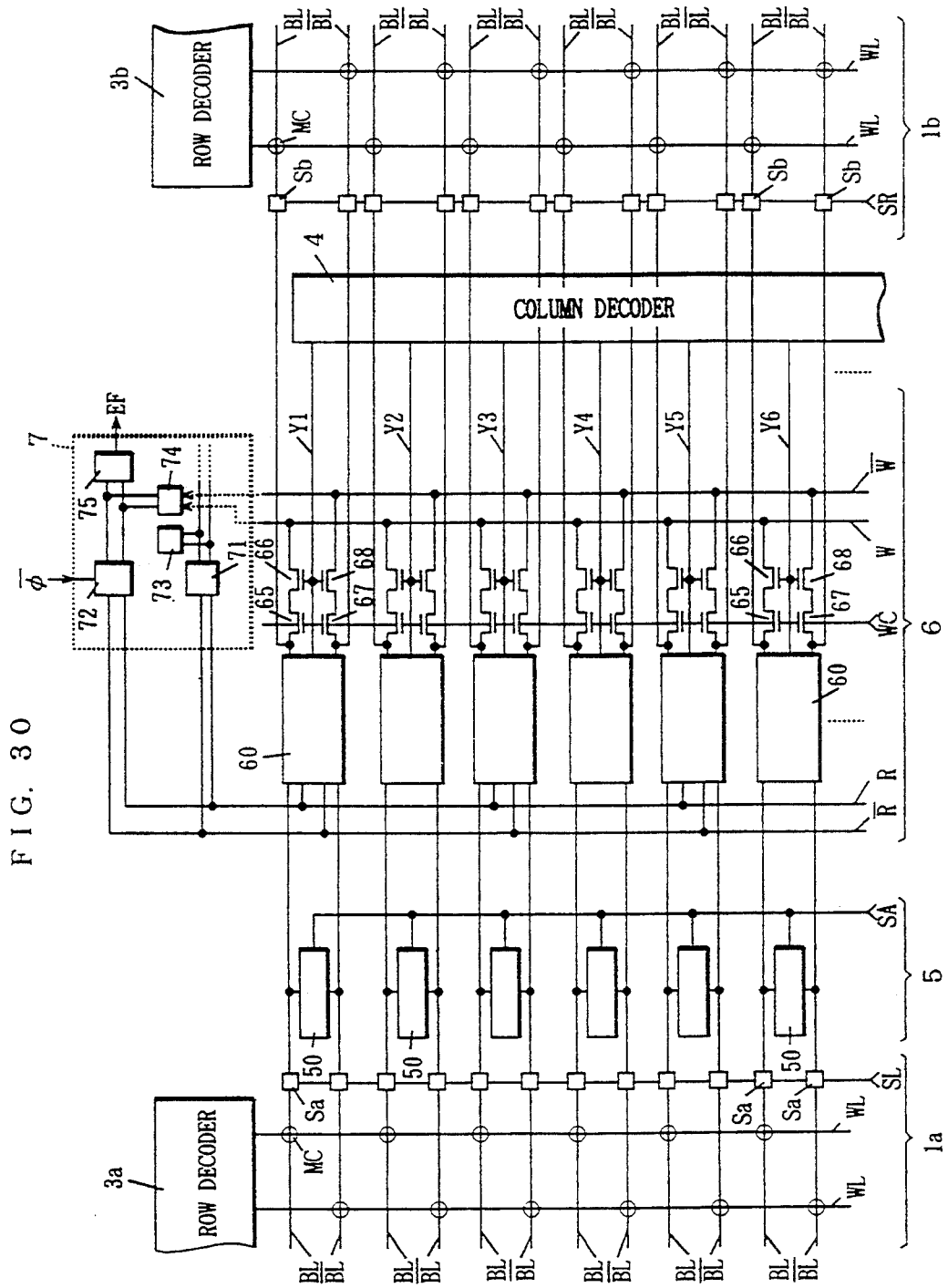
FIG. 30 is a circuit diagram of the structure of the main components of a semiconductor memory device according to a further embodiment of the present invention.
Figure 31:
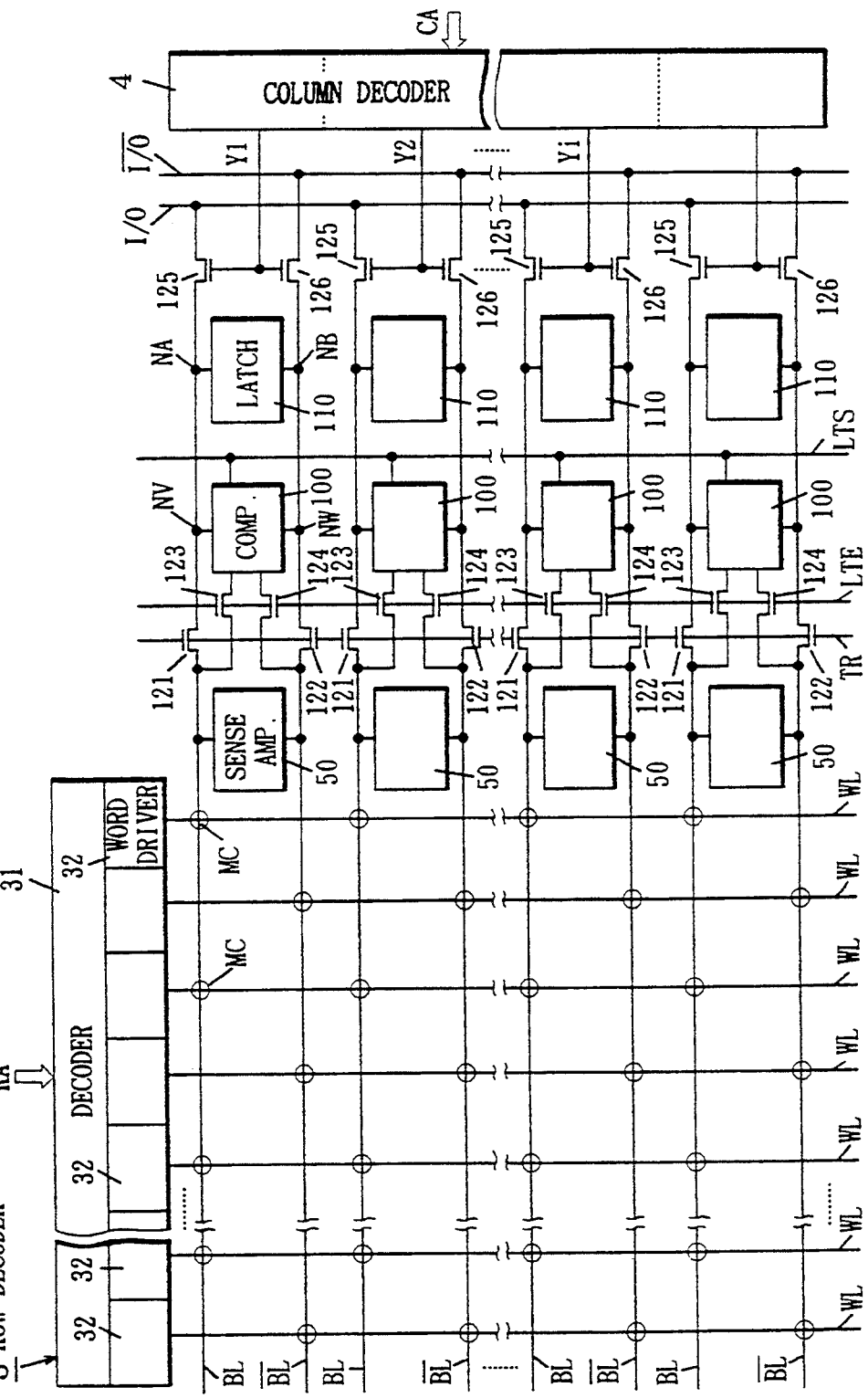
FIG. 31 is a diagram showing a structure of the main components of a conventional semiconductor memory device having a line mode test function.
Figure 32:
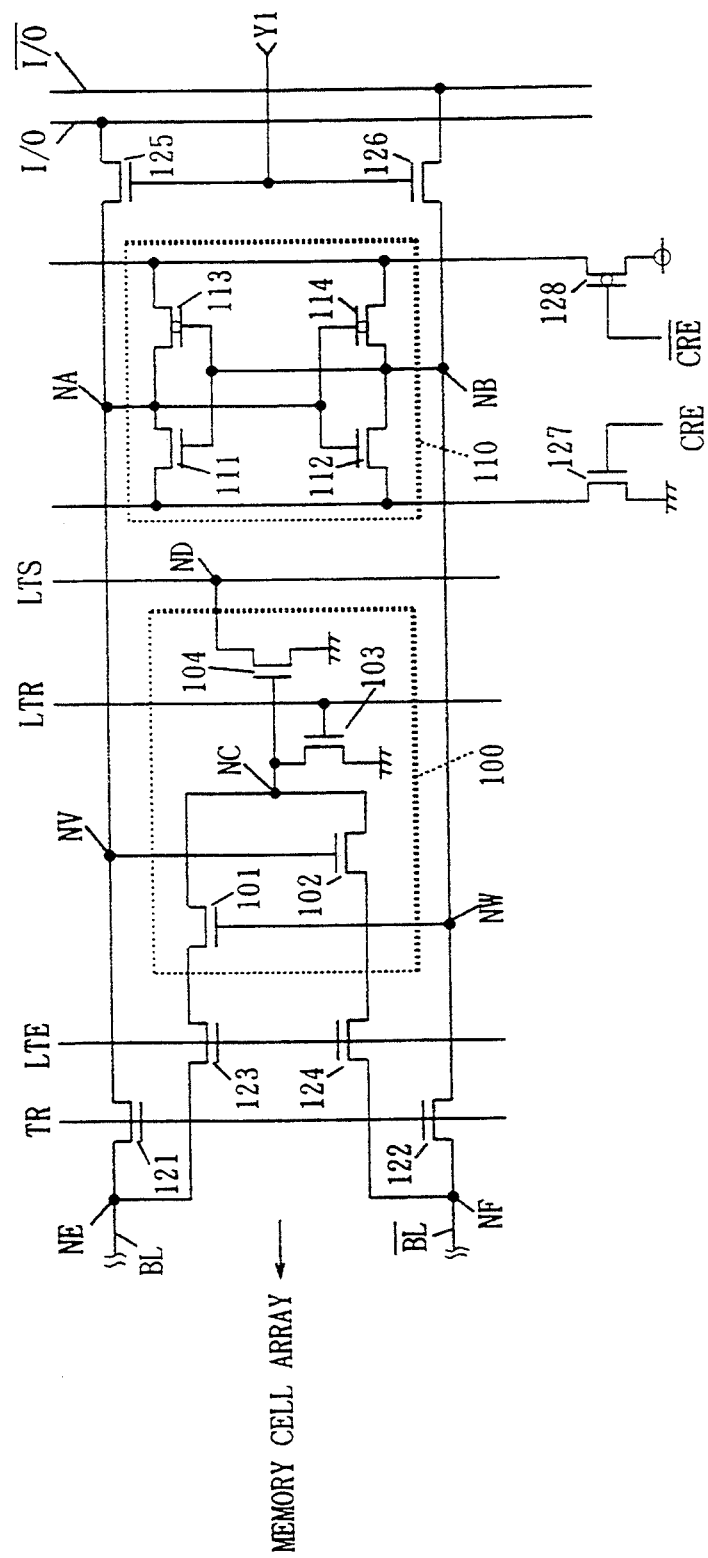
FIG. 32 is a circuit diagram showing the latch circuit and the comparison circuit of the semiconductor memory device of FIG. 31.

FIG. 30 is a circuit diagram showing the structure of the main components of the semiconductor memory device according to a further embodiment of the present invention. This semiconductor memory device comprises a shared sense amplifier structure including two memory array blocks 1a and 1b. Memory array blocks 1a and 1b share sense amplifier group 5 and read/write gates 6. Each bit line pair BL, $\overline{BL}$ an memory array block 1a as connected to the corresponding sense amplifier 50 and the corresponding first differential amplifier 60 via switch Sa. Each bit line BL, $\overline{BL}$ in memory array block 1b is connected to the corresponding sense amplifier 50 and the corresponding first differential amplifier 60 via switch Sb. One of switches Sa and Sb is selectively turned on by switch signals SL and SR.

According to the present embodiment, only one set of sense amplifier group 5 and one set of read/write gates 6 are required for the two memory array blocks 1a and 1b. This reduces the layout area. The present embodiment is particularly advantageous to reduce the layout area because sense amplifier group 5 and read/write gates 6 occupy a large area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array including a plurality of memory cells arranged in a plurality of rows and columns,
   selecting means for simultaneously selecting a predetermined number of columns of said memory array in a selected row during testing operation and for selecting one of said plurality of columns during normal operation,
   reading means for reading data stored in the memory cells of the selected row and columns,
   test means for simultaneously comparing data read by said reading means with a predetermined expected data value during testing operation, and
   indicating means for providing a result of said test means,
   wherein said test means comprises:
   a plurality of first amplifying means corresponding respectively to the plurality of columns of said memory array,
   second amplifying means, and
   expected data input means for storing an expected data value,
   wherein the first amplifying means corresponding to the column selected by said selecting means and said second amplifying means form a current mirror type amplifier during normal reading operation,
   and wherein each of the plurality of first amplifying means corresponding to the respective columns selected by said selecting means compares data read out from the corresponding columns with the predetermined expected data value during a testing operation.

2. The semiconductor memory device according to claim 1, further comprising control means for controlling said selecting means to select other columns of said memory array for simultaneous testing.

3. The semiconductor memory device according to claim 2, further comprising:
   a write bus,
   a read bus,
   connecting means for connecting a single column selected by said selecting means to said write bus during normal writing operation, and
   activation means for activating the respective first amplifying means corresponding to a column selected by said selecting means.

4. The semiconductor memory device according to claim 1, wherein said test means carries out line mode testing.

5. A semiconductor memory device comprising:
   a memory array including a plurality of word lines, a plurality of bit line pairs provided to cross said plurality of word lines, and a plurality of memory cells provided at the crossings of said word lines and said bit line pairs,
   a write bus,
   a read bus,
   a plurality of first amplifying means each provided between each of said plurality of bit line pairs and said read bus,
   second amplifying means,
   expected data input means for storing an expected data value,
   selecting means for selecting one of said plurality of bit line pairs for reading and writing during normal operation, and for simultaneously selecting a predetermined number of bit line pairs during testing operation,
   connecting means for connecting a bit line pair selected by said selecting means to said write bus during normal operation, and
   activation means for activating a first amplifying means corresponding to a selected bit line pair,
   wherein the activated first amplifying means and said second amplifying means form a current mirror type amplifier during normal reading operation,
   wherein the activated first amplifying means compares data of the corresponding bit line pair with said expected data value for providing the comparison result thereof to said read bus during testing operation.

6. The semiconductor memory device according to claim 5, further comprising:
   a data bus,
   a line test bus, and
   switch means for connecting said read bus to said data bus during normal reading operation, and for connecting said read bus to said line test bus during testing operation.

7. The semiconductor memory device according to claim 6, further comprising:
   setting means for setting said semiconductor memory device to a normal operation mode or a test operation mode.

8. The semiconductor memory device according to claim 7, wherein said setting means comprises
   at least one external terminal for receiving an externally applied signal, and
   detection means for generating a signal for setting said semiconductor memory device to a test mode when a voltage of a level higher than a normal logic level is applied to any of said at least one external terminal.

9. The semiconductor memory device according to claim 7, wherein said setting means further comprises
   a plurality of external terminals for receiving externally applied signals, a plurality of high-voltage detection means respectively connected to said plurality of external terminals for generating a detection signal when a voltage of a level higher than a normal logic level is applied to an external terminal, and setting signal generating means for generating a signal to set said semiconductor memory device to a test mode when said detection signal is generated from one of said plurality of high-voltage detection means.

10. The semiconductor memory device according to claim 9, wherein said selecting means comprises means responsive to said detection signal applied from one of said plurality of high voltage detection means said plurality of high-voltage detection means and said setting signal applied from said setting signal generating means for selecting a plurality of bit line pairs simultaneously.

11. The semiconductor memory device according to claim 5, further comprising:

error detection means for providing an error flag in response to a comparison indication received from said first amplifying means.

12. The semiconductor memory device according to claim 5, wherein each of said plurality of first amplifying means forms a differential amplifier.

13. The semiconductor memory device according to claim 5, wherein said second amplifying means forms a differential amplifier.

14. The semiconductor memory device according to claim 13, wherein said differential amplifier comprises a symmetric type differential amplifier.

15. The semiconductor memory device according to claim 13, wherein said differential amplifier comprises a double differential amplifier.

16. The semiconductor memory device according to claim 13, wherein said differential amplifier comprises a double symmetric type differential amplifier.

17. The semiconductor memory device according to claim 5, wherein said selecting means comprises column decoder means responsive to an externally applied address signal for generating a plurality of selecting signals for simultaneously selecting a plurality of bit line pairs during testing operation and for generating a single selecting signal during normal reading and writing operation.

18. The semiconductor memory device according to claim 5, wherein said test operation comprises line mode testing operation.

19. A method of operating a semiconductor memory device comprising a memory array including a plurality of word lines, a plurality of bit line pairs provided to cross said plurality of word lines, and a plurality of memory cells provided at the crossings of said word lines and said bit line pairs; a write bus; a read bus; a plurality of first amplifying means each provided between said plurality of bit line pairs and said read bus; and second amplifying means; said method comprising the steps of:

designating an operating mode;

in response to the designation of a test mode the steps of:

generating a first expected data value, simultaneously selecting an arbitrary first plurality of bit line pairs, amplifying stored data from said arbitrary first plurality of bit line pairs, simultaneously comparing with said plurality of first amplifying means the amplified stored data of the corresponding first plurality of bit line pairs with said first expected data value, applying a signal to said read bus in response to the step of comparing, generating a second expected data value, simultaneously selecting an arbitrary second plurality of bit line pairs, amplifying stored data from said arbitrary second plurality of bit line pairs, simultaneously comparing the amplified data of the corresponding second plurality of bit line pairs with said second expected data value, and in response to the designation of a normal operation mode the steps of:

selecting any one of said plurality of bit line pairs, connecting said selected bit line pair to said write bus for a writing operation, and amplifying stored data from said selected bit line pair for a reading operation, wherein said step of amplifying for a reading operation includes the step of implementing a current mirror type amplifier by activating a respective first amplifying means and said second amplifying means.

20. A semiconductor device comprising:

a memory array including a plurality of memory cells arranged in a plurality of rows and columns, selecting means for simultaneously selecting a predetermined number of columns of said memory array in a selected row during testing operation and for selecting one of said plurality of columns during normal operation, reading means for reading data stored in the memory cells of the selected row and columns, test means for simultaneously comparing data read by said reading means with each other during testing operation, and indicating means for providing a result of said test means, wherein said test means comprises:

a plurality of first amplifying means corresponding respectively to the plurality of columns of said memory array, and second amplifying means, wherein the first amplifying means corresponding to the column selected by said selecting means and said second amplifying means form a current mirror type amplifier during normal reading operation, and wherein said plurality of first amplifying means compare all data read out from the corresponding columns with each other during testing operation.

21. The semiconductor memory device according to claim 20, further comprising control means for controlling said selecting means to select other columns of said memory array for simultaneous testing.

22. A semiconductor memory device comprising:

first and second memory arrays including a plurality of memory cells arranged in a plurality of rows and columns, switching means for selecting one of said first and second memory arrays, selecting means for simultaneously selecting a predetermined number of columns in a selected row in the selected memory array during testing operation and for selecting one of said plurality of columns during normal operation, reading means for reading data stored in the plurality of memory cells of the selected row and columns, test means for simultaneously comparing data read by said reading means with a predetermined expected data value during testing operation, and indicating means for providing a result of said test means, wherein said test means comprises:

a plurality of first amplifying means corresponding respectively to the plurality of columns of said selected memory array, second amplifying means, and expected data input means for storing an expected data value, wherein the first amplifying means corresponding to the column selected by said selecting means and said second amplifying means form a current mirror type amplifier during normal reading operation, and wherein each of the first amplifying means corresponding to the columns selected by said selecting means compares data read out from the corresponding columns with the expected data value during a testing operation.

23. The semiconductor memory device according to claim 22, further comprising control means for controlling said selecting means to select other columns of said selected memory array for simultaneous testing.

* * * * *